(12) United States Patent
Han et al.

(10) Patent No.: US 8,786,058 B2
(45) Date of Patent: Jul. 22, 2014

(54) SEMICONDUCTOR DEVICES AND METHODS OF MANUFACTURING THE SAME

(75) Inventors: Kyu-Hee Han, Hwaseong-si (KR); Byung-Lyul Park, Seoul (KR); Byunghee Kim, Seoul (KR); Sanghoon Ahn, Gyeonggi-do (KR); Sangdon Nam, Seoul (KR); Kyoung-Hee Kim, Incheon (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 167 days.

(21) Appl. No.: 13/289,576

(22) Filed: Nov. 4, 2011

(65) Prior Publication Data

US 2012/0112361 A1      May 10, 2012

(30) Foreign Application Priority Data

Nov. 8, 2010   (KR) .................. 10-2010-0110522

(51) Int. Cl.
  *H01L 29/06*  (2006.01)
(52) U.S. Cl.
  USPC ..................... 257/622; 257/522; 257/774

(58) Field of Classification Search
  USPC ................. 257/622, 750, 758, 774, 522, 626
  See application file for complete search history.

(56) References Cited

U.S. PATENT DOCUMENTS

| 6,949,456 | B2 * | 9/2005 | Kumar ........................... 438/619 |
| 2004/0097065 | A1 * | 5/2004 | Lur et al. ....................... 438/619 |
| 2006/0166486 | A1 * | 7/2006 | Stamper ......................... 438/624 |
| 2008/0224261 | A1 * | 9/2008 | Hsu et al. ...................... 257/530 |
| 2009/0045391 | A1 * | 2/2009 | Won .................................. 257/9 |
| 2009/0115061 | A1 * | 5/2009 | Chen ............................. 257/751 |
| 2010/0032764 | A1 | 2/2010 | Andry et al. |
| 2010/0164117 | A1 | 7/2010 | Chen |
| 2012/0292746 | A1 * | 11/2012 | Lee et al. ...................... 257/621 |

FOREIGN PATENT DOCUMENTS

JP      2004-128170      4/2004

* cited by examiner

*Primary Examiner* — S. V. Clark
(74) *Attorney, Agent, or Firm* — F. Chau & Associates, LLC

(57) ABSTRACT

A semiconductor device is provided. The semiconductor device includes a substrate having a via hole comprised of a first region having a first width and a second region having a second width greater than the first width, wherein at least a portion of the substrate is exposed in the via hole, and an insulating region having an air gap spaced apart from and surrounding the first region of the via hole.

14 Claims, 30 Drawing Sheets

SEMICONDUCTOR DEVICES AND METHODS OF MANUFACTURING THE SAME

CROSS-REFERENCE TO RELATED APPLICATION

This U.S. non-provisional patent application claims priority under 35 U.S.C. §119 to Korean Patent Application No. 10-2010-0110522, filed on Nov. 8, 2010, the entire contents of which are hereby incorporated by reference.

BACKGROUND

The present inventive concept herein relates to semiconductor devices and methods of manufacturing the same, and more particularly, to a semiconductor device including a through silicon via (TSV) and a method of manufacturing the same.

An electronics industry trend is to manufacture lighter, smaller and faster products at low cost that perform multiple functions at high performance levels. In an effort to meet these demands, multi-chip stacked package technology or system in package technology has been used. The multi-chip stacked package technology or the system in package technology uses through silicon vias.

A multi-chip stacked package or a system in package may perform functions of a plurality of unit semiconductor devices in one semiconductor package. Although a thickness of the multi-chip stacked package or the system in package may be relatively larger when compared with a conventional unit chip package, a size of the multi-chip stacked package or the system in package may be similar to that of the unit chip package. The multi-chip stacked package or the system in package may be used in the products such as, for example, a cell phone, a notebook computer, a memory card or a portable camcorder, which operate at high performance levels and are small or portable.

SUMMARY

Embodiments of the inventive concept provide a semiconductor device. The semiconductor device may include a substrate having a via hole comprised of a first region having a first width and a second region having a second width greater than the first width, wherein at least a portion of the substrate is exposed in the via hole, and an insulating region having an air gap spaced apart from and surrounding the first region of the via hole.

Embodiments of the inventive concept also provide a semiconductor device including a substrate, a through silicon via comprised of a first region having a first width and a second region having a second width greater than the first width, wherein the through silicon via penetrates the substrate, and an insulating film between the substrate and the through silicon via, wherein the substrate includes an air gap spaced apart from and surrounding the first region of the through silicon via.

Embodiments of the inventive concept also provide a method of manufacturing a semiconductor device including preparing a substrate, forming a first hole and a second hole in the substrate, wherein the first hole exposes at least a portion of the substrate and the second hole surrounds the first hole and a portion of the substrate is interposed between the first and second holes, and recessing the portion of the substrate between the first hole and the second hole to form a via hole comprised of a first region having a first width and a second region having a second width greater than the first width, and to form an air gap surrounding the first region of the via hole, the air gap being disposed under the second region of the via hole.

Embodiments of the inventive concept also provide a semiconductor package including the semiconductor device of the inventive concept. The semiconductor package may be a package including stacked first and second semiconductor devices. Each of the first and second semiconductor devices includes a substrate, a through silicon via comprised of a first region having a first width and a second region having a second width greater than the first width and an insulating film between the substrate and the through silicon via. The substrate has an air gap spaced apart from and surrounding the first region of the through silicon via.

Embodiments of the inventive concept also provide a semiconductor device comprising a semiconductor substrate, a through silicon via extending from a first surface of the substrate to a second surface of the substrate opposite the first surface, wherein the through silicon via includes a first region having a first width and a second region having a second width greater than the first width, and an air gap surrounding and spaced apart from the first region of the through silicon via, wherein the air gap is positioned under the second region of the through silicon via.

BRIEF DESCRIPTION OF THE FIGURES

The embodiments of the inventive concept will be apparent from the more particular description of exemplary embodiments of the inventive concept, as illustrated in the accompanying drawings in which like reference characters may refer to the same or similar parts throughout the different views. The drawings are not necessarily to scale, emphasis instead being placed upon illustrating the principles of the inventive concept. In the drawings, the thickness of layers and regions may be exaggerated for clarity.

DETAILED DESCRIPTION OF THE EMBODIMENTS

Exemplary embodiments of the inventive concept will be described below in more detail with reference to the accompanying drawings. The embodiments of the inventive concept may, however, be embodied in different forms and should not be construed as limited to the embodiments set forth herein. Like numbers may refer to like elements throughout.

It will be understood that when an element is referred to as being "connected" or "coupled" to another element, it can be directly connected or coupled to the other element or intervening elements may be present.

Figure 1:
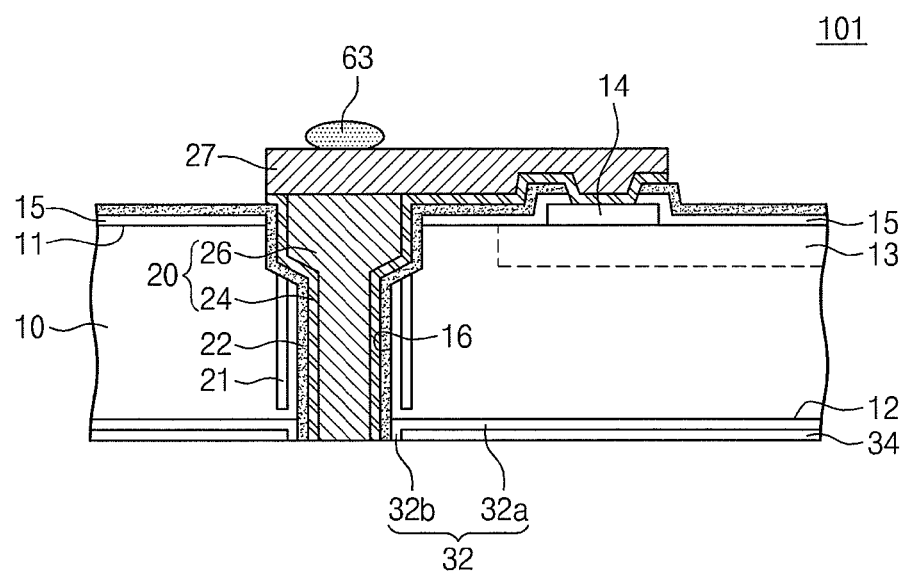
FIG. 1 is a cross sectional view of a semiconductor device in accordance with an embodiment of the inventive concept.

FIG. 1 is a cross sectional view of a semiconductor device in accordance with an embodiment of the inventive concept. For convenience of description, in a semiconductor device, a region in which a through silicon via is formed is illustrated.

Referring to FIG. 1, a substrate 10 of a semiconductor device 101 includes a first surface 11 and a second surface 12 positioned opposite to the first surface 11. According to an embodiment, the semiconductor device 101 may be a semiconductor chip including an integrated circuit 13. The substrate 10 includes the integrated circuit 13 in the substrate 10. For example, the integrated circuit 13 may be formed under the first surface 11 of the substrate 10, and may include a transistor or a memory device.

A pad 14 electrically connected to the integrated circuit 13 may be provided on the integrated circuit 13. The pad 14 may be formed of, for example, aluminum (Al) or copper (Cu). According to an embodiment, if the pad 14 is formed of aluminum (Al), the pad 14 may be provided on the integrated circuit 13. Alternatively, if the pad 14 is formed of copper (Cu), the pad 14 may have a damascene structure and may be included in the integrated circuit 13.

The substrate 10 including the pad 14 may further include a passivation film 15 including an opening in the passivation film 15 exposing a portion of the pad 14 on the first surface 11. The passivation film 15 may protect the integrated circuit 13 from an external environment and may be formed of, for example, silicon oxide, silicon nitride or combinations thereof.

A via hole 16 for forming a through silicon via 20 is provided to penetrate the substrate 10 while being separated from the integrated circuit 13. The via hole 16 may be provided in a peripheral circuit region (not shown) or a scribe lane. According to an embodiment, the via hole 16 may penetrate or overlap the pad 14. The via hole 16 includes a first region having a first width and a second region having a second width greater than the first width. The first region of the via hole 16 may be located at the second surface 12 of the substrate 10 and the second region of the via hole 16 may be located at the first surface 11 of the substrate 10. According to an embodiment, a portion of the second region connected to the first region of the via hole 16 may have a gradually narrowing width.

An air gap 21 surrounds the first region of the via hole 16 while being spaced apart from the first region of the via hole 16. The air gap 21 may be spaced apart from the first region of the via hole 16 and a portion of the substrate 10 may be interposed between the air gap 21 and the first region of the via hole 16. The air gap 21 may be disposed under the second region of the via hole 16.

A via hole insulating film 22 may be provided on a sidewall of the via hole 16. The via hole insulating film 22 may include, for example, silicon oxide, silicon oxynitride, silicon nitride or combinations thereof. According to an embodiment, the via hole insulating film 22 may be a silicon oxide film. The via hole insulating film 22 extends from the sidewall of the via hole 16 to positions on the passivation film 15. In this case, the via hole insulating film 22 includes an opening exposing a portion of the pad 14 together with the passivation film 15. According to an embodiment, if a width of the air gap 21 is sufficiently small, the via hole insulating film 22 may not enter inside the air gap 21.

The through silicon via 20 is provided in the via hole 16. The via hole insulating film 22 is positioned between the through silicon via and sidewalls of the via hole 16. A conductive interconnection 27 extends on the first surface 11 of the substrate 10 from the through silicon via 20 to the pad 14. The conductive interconnection 27 may contact the through silicon via 20 so that the through silicon via 20 is electrically connected to the pad 14. The through silicon via 20 may include a barrier film 24 formed on the via hole insulating film 22 and a conductive film 26 formed on the barrier film 24. The barrier film 24 may include, for example, titanium (Ti), titanium nitride (TiN), tantalum (Ta), tantalum nitride (TaN), ruthenium (Ru), cobalt (Co), manganese (Mn), tungsten nitride (WN), nickel (Ni), nickel boride (NiB) or a double film of titanium/titanium nitride. The barrier film 24 may prevent conductive material of the conductive film 26 and the conductive interconnection 27 from diffusing into the substrate 10. The conductive film 26 may include, for example, silver (Ag), gold (Au), copper (Cu), tungsten (W) or indium (In). According to an embodiment, the conductive interconnection 27 may include the same material as the conductive film 26.

A connection pattern 63 may be provided on the conductive interconnection 27. The connection pattern 63 may be formed using, for example, solder material. When semiconductor devices are stacked, a reflow of the connection pattern 63 may be performed so that through silicon vias of the semiconductor devices being stacked are well connected to each other. According to an embodiment, the connection pattern 63 may be formed on a position corresponding to a position where the via hole 16 is formed.

First and second sub insulating films 32 and 34 are sequentially provided on the second surface 12 of the substrate 10. The first and second sub insulating films 32 and 34 may prevent the second surface 12 of the substrate 10 from being contaminated from conductive material when a process of exposing the conductive connection portion 26 is performed. The first sub insulating film 32 may be a silicon oxide film and the second sub insulating film 34 may be a silicon nitride film. The first sub insulating film 32 is provided directly on the second surface 12 of the substrate 10 and the second sub insulating film 34 is provided directly on the first sub insulating film 32.

The first sub insulating film 32 may include a first portion 32a provided on the second surface 12 of the substrate 10 and a second portion 32b provided on a side of the through silicon via 20 protruding from the second surface 12 of the substrate 10. Accordingly, the first sub insulating film 32 may have an "L" shaped cross section.

An opening in the first and second sub insulating films 32 and 34 expose the through silicon via 20 and the via hole insulating film 22. According to an embodiment, the through silicon via 20 may be exposed by planarizing the substrate 10 using the second sub insulating film 34 as a planarization stop layer. Thus, the second sub insulating film 34, the via hole insulating film 22 and the through silicon via 20 may have surfaces even with one another.

According to an embodiment, a photolithography process for removing insulating films formed on the through silicon via 20 may be omitted when the through silicon via 20 is exposed through a planarization process using the second sub insulating film 34 as a planarization stop layer. When exposing the through silicon via 20 using a photolithography process, if a width of the through silicon via 20 is small enough, the first and second sub insulating films 32 and 34 may not be easily removed due to a resolution limit of the photolithography process. According to an embodiment of the inventive concept, when using the planarization process, the through silicon via 20 may be easily exposed regardless of a width of the through silicon via 20.

Referring to FIGS. 2 through 7, semiconductor devices in accordance with embodiments of the inventive concept are described. FIGS. 2 through 7 are cross sectional views of semiconductor devices in accordance with embodiments of the inventive concept. In FIGS. 2 through 7, for convenience of description, a region where a through silicon via of the semiconductor device is formed is illustrated. Same or similar elements of the embodiments of the inventive concept may use same reference numerals in the drawings and repetitive descriptions may be omitted.

Figure 2:
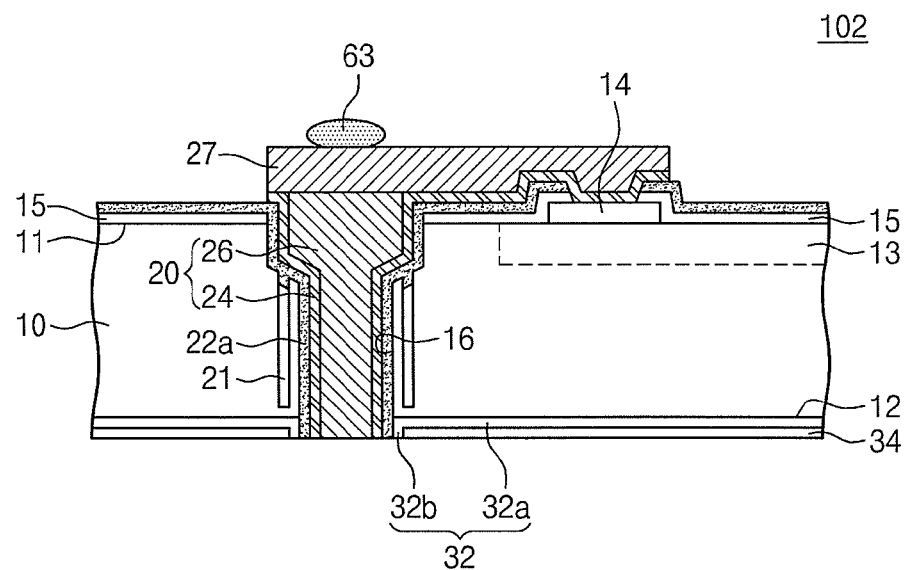
FIG. 2 is a cross sectional view of a semiconductor device in accordance with another embodiment of the inventive concept.

A semiconductor device 102 described with reference to FIG. 2 is different from the semiconductor device 101 in that a via hole insulating film 22a has a different structure from the via hole insulating film 22.

The via hole insulating film 22a provided on a sidewall of the via hole 16 may fill a portion of the air gap 21. The via hole insulating film 22a may fill a part of an upper portion of the air gap 21.

Figure 3:
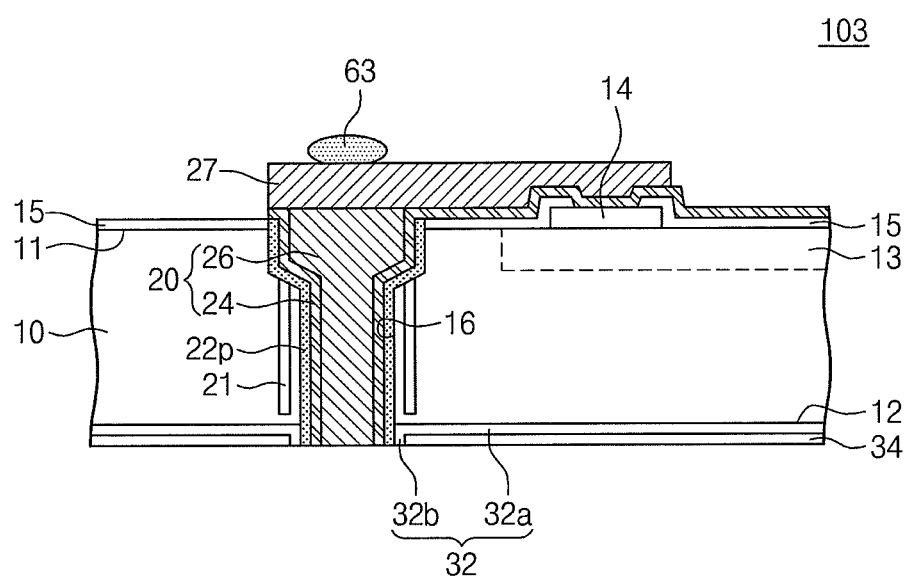
FIG. 3 is a cross sectional view of a semiconductor device in accordance with another embodiment of the inventive concept.

A semiconductor device 103 described with reference to FIG. 3 is different from the semiconductor device 101 described above in that a via hole insulating film 22p includes a different material and has a different structure form the via hole insulating film 22.

The via hole insulating film 22p provided on a sidewall of the via hole 16 may include a polymer. The via hole insulating film 22p may be, for example, a CF-based polymer film. According to an embodiment, the via hole insulating film 22p may be formed by a plasma process using at least one selected from $C_4F_6$, $C_4F_8$, $C_5F_8$, $CHF_3$ and combinations thereof. The CF-based polymer has a dielectric constant lower than silicon oxide. For example, the CF-based polymer has a dielectric constant of about 2.5 and silicon oxide has a dielectric constant of about 3.6. Unlike the via hole insulating film 22 of FIG. 1 that is a silicon oxide film, the via hole insulating film 22p that is the CF-based polymer film may be provided only on the sidewall of the via hole 16 and not extend to positions on the passivation layer 15.

According to an embodiment, as illustrated in FIG. 2, the via hole insulating film 22p provided on the sidewall of the via hole 16 may fill a part of an upper portion of the air gap 21, like the via hole insulating film 22a.

Figure 4:
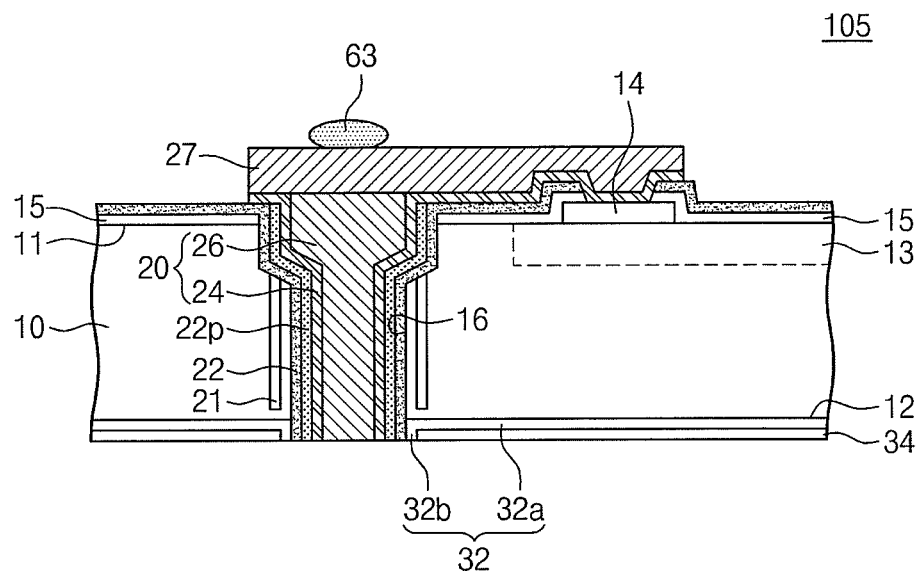
FIG. 4 is a cross sectional view of a semiconductor device in accordance with another embodiment of the inventive concept.

A semiconductor device 105 described with reference to FIG. 4 is different from the semiconductor device 101 described above in that the semiconductor device 105 includes both via hole insulating films 22, 22p.

The via hole insulating films 22, 22p provided on a sidewall of the via hole 16 may include a first insulating film 22 and a second insulating film 22p disposed on the first insulating film 22. The first insulating film 22 may include, for example, silicon oxide, silicon oxynitride, silicon nitride or combinations thereof. For example, the first insulating film 22 may be a silicon oxide film. The second insulating film 22p may include, for example, a polymer. For example, the second insulating film 22p may be a CF-based polymer film. The second insulating film 22p may be formed by a plasma process using at least one selected from $C_4F_6$, $C_4F_8$, $C_5F_8$, $CHF_3$ and combinations thereof. The first insulating film 22 may extend from the sidewall of the via hole 16 to positions on the passivation film 15. In this case, an opening in the first insulating film 22 exposes a portion of the pad 14 together with an opening in the passivation film 15.

Figure 5:
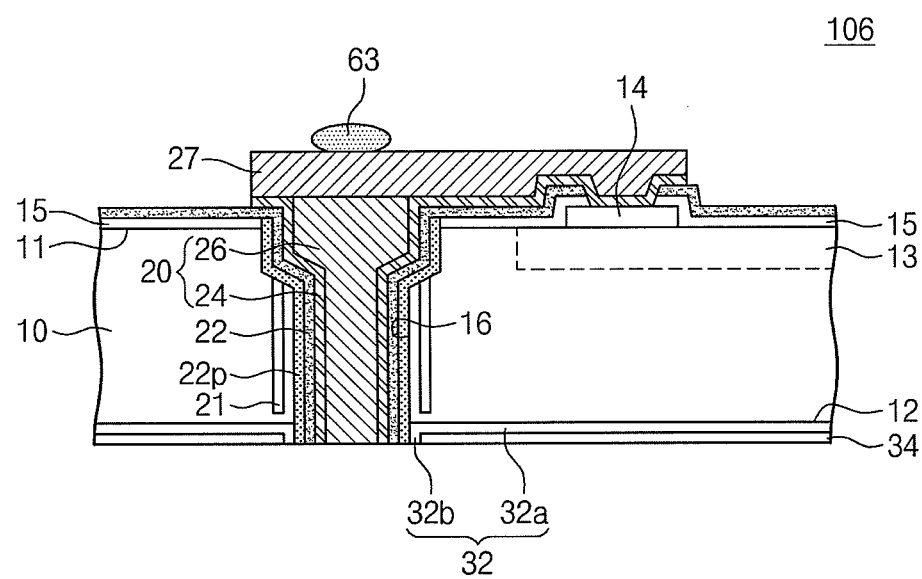
FIG. 5 is a cross sectional view of a semiconductor device in accordance with another embodiment of the inventive concept.

A semiconductor device 106 described with reference to FIG. 5 is different from the semiconductor device 101 described above in that the semiconductor device 106 includes both via hole insulating films 22p, 22, and has a different structure from the semiconductor device 105 in FIG. 4.

The via hole insulating films 22p, 22 provided on a sidewall of the via hole 16 may include a first insulating film 22p and a second insulating film 22 disposed on the first insulating film 22p. The first insulating film 22p may include, for example, a polymer. The first insulating film 22p may be, for example, a CF-based polymer film. The first insulating film 22p may be formed by a plasma process using at least one selected from $C_4F_6$, $C_4F_8$, $C_5F_8$, $CHF_3$ and combinations thereof. The second insulating film 22 may include, for example, silicon oxide, silicon oxynitride, silicon nitride or combinations thereof. For example, the second insulating film 22 may be a silicon oxide film. The second insulating film 22 may extend from the sidewall of the via hole 16 to positions on the passivation film 15. In this case, an opening in the second insulating film 22 exposes a portion of the pad 14 together with an opening in the passivation film 15.

Unlike what is illustrated in FIGS. 4 and 5, according to an embodiment, the via hole insulating film 22 or 22p provided on a sidewall of the via hole 16 may be provided only on a part of the sidewall of the via hole 16.

Figure 6:
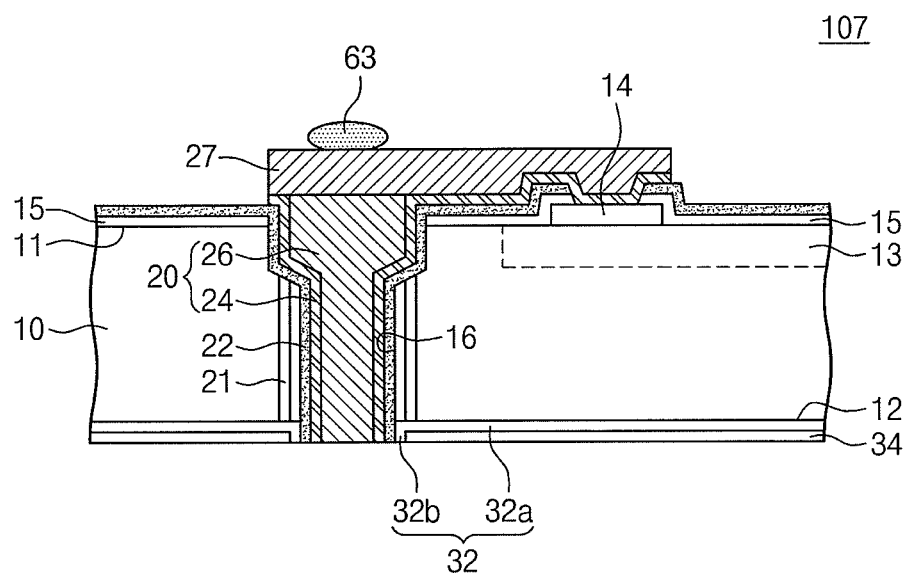
FIG. 6 is a cross sectional view of a semiconductor device in accordance with another embodiment of the inventive concept.

A semiconductor device 107 described with reference to FIG. 6 is different from the semiconductor device 101 described above in that an air gap 21 has a different structure.

The air gap 21 surrounding the first region of the via hole 16 may extend to the second surface 12 of the substrate 10. Thus, the air gap 21 exposed to the second surface 12 of the substrate 10 may be covered by the first sub insulating film 32 or may be partly filled with the first sub insulating film 32.

Figure 7:
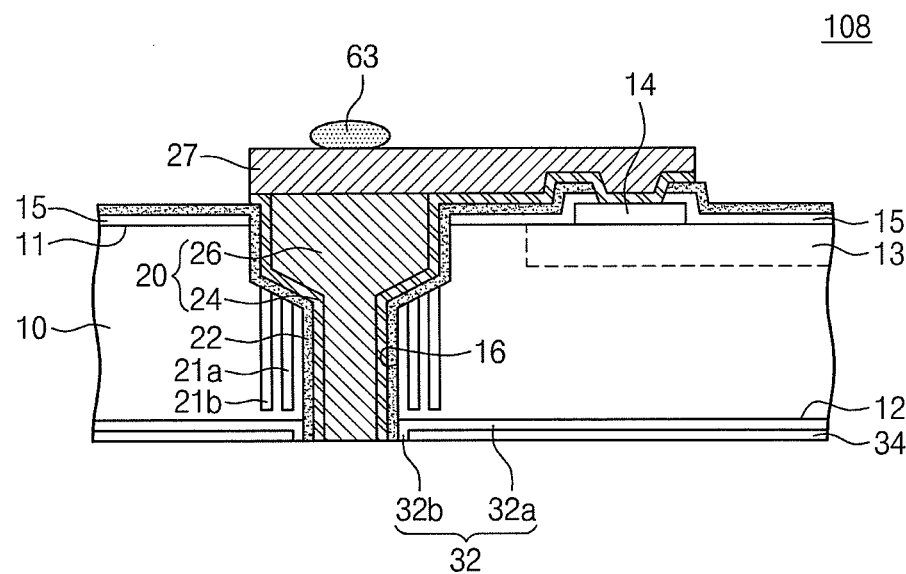
FIG. 7 is a cross sectional view of a semiconductor device in accordance with another embodiment of the inventive concept.

A semiconductor device 108 described with reference to FIG. 7 is different from the semiconductor device 101 described above in that a via hole 16 has a different structure, and there are a plurality of air gaps.

The plurality of air gaps 21 surrounding a first region of the via hole 16 may be disposed under the second region of the via hole 16. A portion of the substrate 10 may be interposed between the plurality of air gaps 21.

Although not illustrated in the drawings, an air gap having different structure from those things illustrated in FIGS. 1 through 7 may surround the first region of the via hole 16. The air gap having a different structure may be determined by various plasma process conditions used in etching for forming the air gap.

According to some embodiments of the inventive concept, by having a structure of a through silicon via including an air gap, while not reducing an area contacting a metal interconnection, a structure of through silicon via may be realized such that a capacitance between the through silicon vias and a contact resistance may be lowered. Thus, semiconductor devices having improved electrical characteristics and improved reliability may be provided.

A method of manufacturing a semiconductor device in accordance with embodiments of the inventive concept is described below. FIGS. 8A through 8J are cross sectional views illustrating a method of manufacturing a semiconductor device in accordance with embodiments of the inventive concept.

Figure 8A:
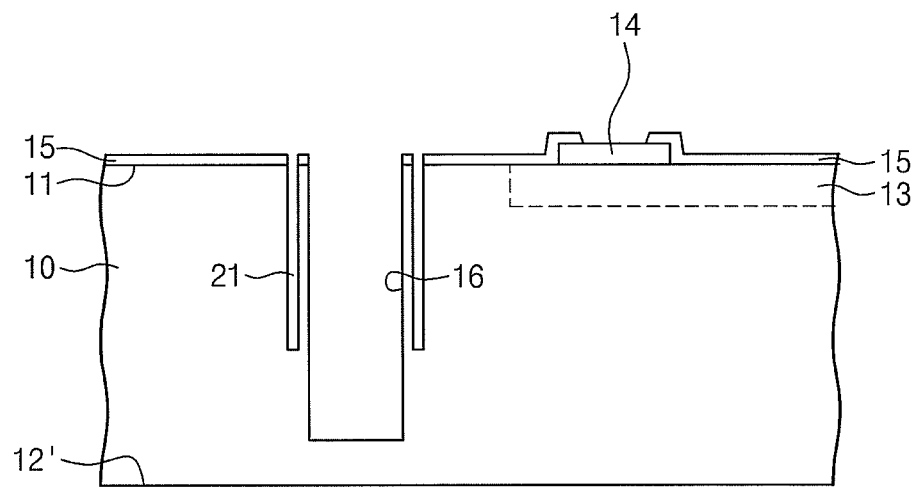
FIGS. 8A through 8I are cross sectional views illustrating a method of manufacturing a semiconductor device in accordance with an embodiment of the inventive concept.

Referring to FIG. 8A, an integrated circuit 13 is formed in a substrate 10 and/or on a first surface 11 of the substrate 10. A pad 14 electrically connected to the integrated circuit 13 is formed on the integrated circuit 13. According to an embodiment, the integrated circuit 13 may be formed before the pad 14 is formed. If the pad 14 is formed of, for example, aluminum, the pad 14 may be formed on the integrated circuit 13 as illustrated in FIG. 8A. If the pad 14 is formed of, for example, copper, the pad 14 has a damascene structure and may be formed in the integrated circuit 13.

A passivation film 15 including an opening exposing a portion of the pad 14 may be formed on the first surface 11 of the substrate 10 on which the pad 14 is formed. The passivation film 15 may protect the integrated circuit 13 from an external environment and may be formed of, for example, silicon oxide, silicon nitride or combinations thereof.

A first hole 16 recessed to a predetermined depth from the first surface 11 of the substrate 10 and a second hole 21 surrounding the first hole 16 are formed. One or more second holes 21 may be formed. If there are a plurality of second holes 21, a portion of the substrate 10 may be interposed between the second holes 21. A portion of the substrate may also be interposed between the second hole 21 and the first hole 16. The first and second holes 16 and 21 may be formed in a peripheral circuit region (not illustrated) or a scribe lane. The first and second holes 16 and 21 may also be formed to penetrate the pad 14 or overlap the pad 14. The first and second holes 16 and 21 may be formed using, for example, a dry etching, a wet etching, and a drilling using a laser or a mechanical drilling. Depths of the first and second holes 16 and 21 may be greater than a thickness of the integrated circuit 13 and smaller than a thickness of the substrate 10. Thus, the first and second holes 16 and 21 may be formed to be spaced apart from an initial second surface 12' of the substrate 10.

The first and second holes 16 and 21 may be formed by forming a first mask pattern (not illustrated) exposing a first hole region and a second hole region on the first surface 11 of the substrate 10, and then etching the substrate 10 using the first mask pattern as an etching mask. Since widths of the first mask pattern exposing the first and second hole regions respectively are different, the first and second holes 16 and 21 may be formed to have different depths respectively. Since a width of the first hole region is greater than a width of the second hole region, the first hole 16 may be formed to have a depth greater than a depth of the second hole 21.

Figure 8B:
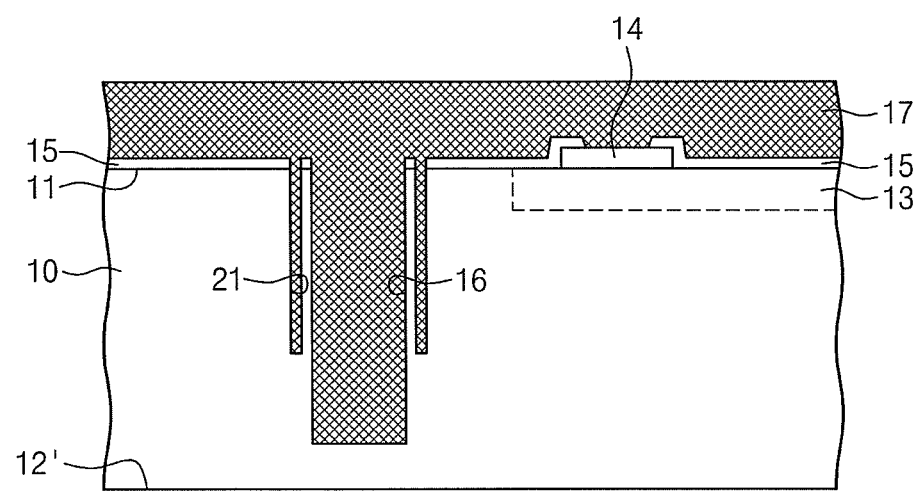

Referring to FIG. 8B, a gap fill material 17 filling the first and second holes 16 and 21 is deposited. The gap fill material 17 may include, for example, an organic substance or inorganic substance. The organic substance may include, for example, a photoresist-based mask or a spin-on hard mask. The gap fill material 17 may be formed using, for example, a spin coating method. The spin coating method may include a spin on glass method or a spin on dielectric method.

Figure 8C:
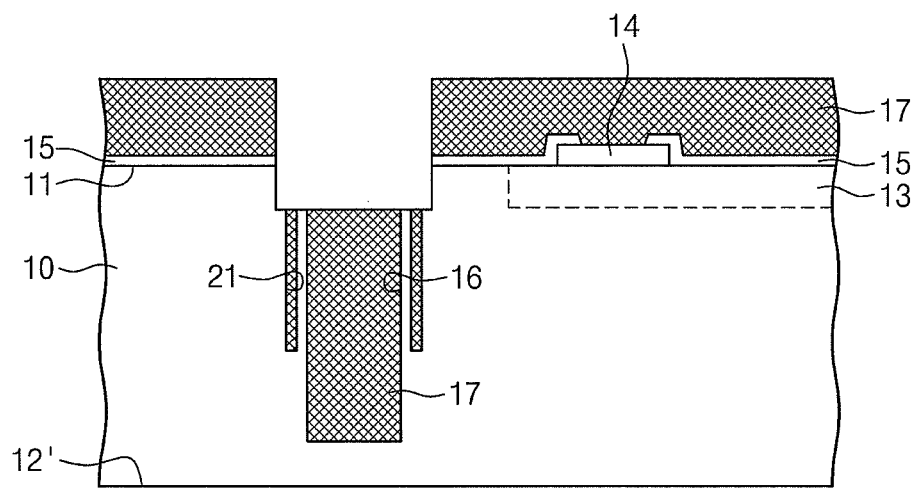

Referring to FIG. 8C, a second mask pattern (not illustrated) exposing a region including the first and second holes 16 and 21 is formed on the first surface 11 of the substrate 10 on which the gap fill material 17 is formed, and then the gap fill material 17 and a portion of the substrate 10 between the first hole 16 and the second hole 21 are recessed by an etching process using the second mask pattern as an etching mask.

Unlike what is illustrated in the drawing, due to a difference of etching speed between the gap fill material 17 and the substrate 10, a surface including the recessed gap fill material 17 and the substrate 10 between the first hole 16 and the second hole 21 may have a gradually narrowing width going downward.

Figure 8D:
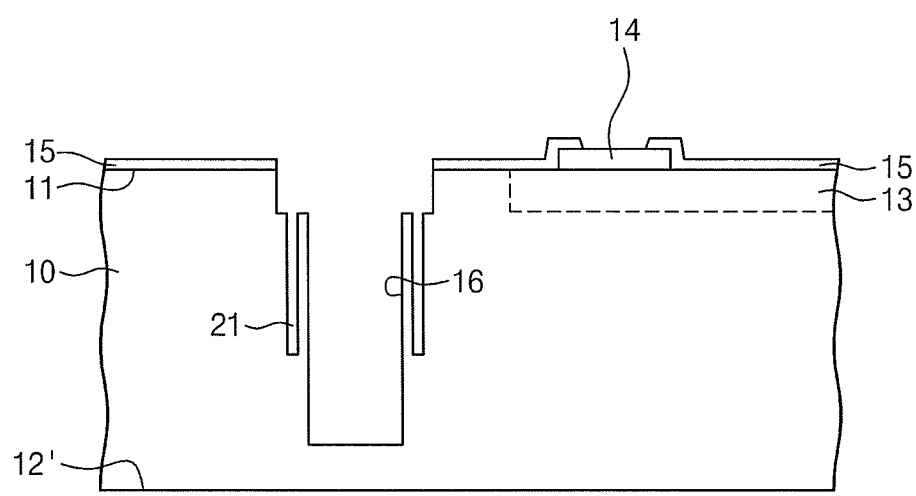

Referring to FIG. 8D, a remaining gap fill material 17 is removed. The remaining gap fill material 17 may be removed using, for example, an ashing method or a wet etching method. As a result, a via hole 16 including a first region having a first width and a second region having a second width greater than the first width and an air gap 21 disposed under the second region and surrounding at least a portion of the first region of the via hole 16 may be formed.

Figure 8E:
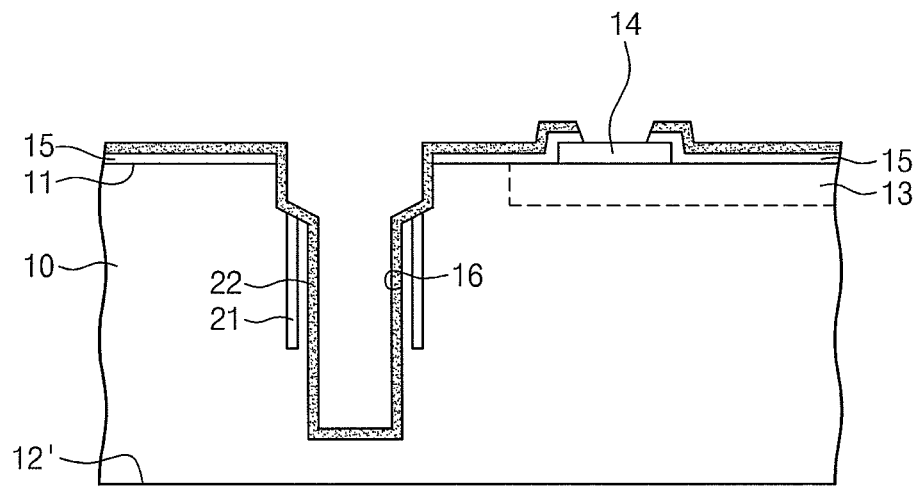

Referring to FIG. 8E, a via hole insulating film 22 is formed on an inner surface of the via hole 16. The via hole insulating film 22 may extend onto the first surface 11 of the substrate 10 from the inner surface of the via hole 16. A portion of the via hole insulating film 22 formed on the pad 14 is removed using a photolithography process to expose a portion of the pad 14.

Although not illustrated in the drawing, the via hole insulating film 22 may be formed to fill a portion of the air gap 21. For example, the via hole insulating film 22 may fill a part of an upper portion of the air gap 21.

The via hole insulating film 22 may include, for example, a silicon oxide film, a silicon oxynitride film, a silicon nitride film, polymer or combinations thereof. The polymer may be, for example, a CF-based polymer. The CF-based polymer may be formed by a plasma process using at least one selected from $C_4F_6$, $C_4F_8$, $C_5F_8$, $CHF_3$ and combinations thereof.

If the via hole insulating film 22 is a silicon oxide film, a silicon oxynitride film or a silicon nitride film, the via hole insulating film 22 may extend onto the first surface 11 of the substrate 10 from the inner surface of the via hole 16. If the via hole insulating film 22 is a CF-based polymer film, the via hole insulating film 22 is formed only on an inner surface of the via hole 16 and does not extend onto the first surface 11 of the substrate 10.

Forming the via hole insulating film 22 of the CF-based polymer may expose the via hole 16 to a plasma process using a CF-based gas. The CF-based gas may include at least one of $C_4F_6$, $C_4F_8$, $C_5F_8$, $CHF_3$ and combinations thereof. A CF-Based polymer ($CF_2$), is created by $CF_x$ ingredients generated by a plasma process using the CF-based gas to form the via hole insulating film 22 on a sidewall of the via hole 16.

Multiple via hole insulating films 22 including a first insulating film which is a silicon oxide film, a silicon oxynitride film or a silicon nitride film and a second insulating film including a polymer film, may be formed instead of a single via hole insulating film.

Figure 8F:
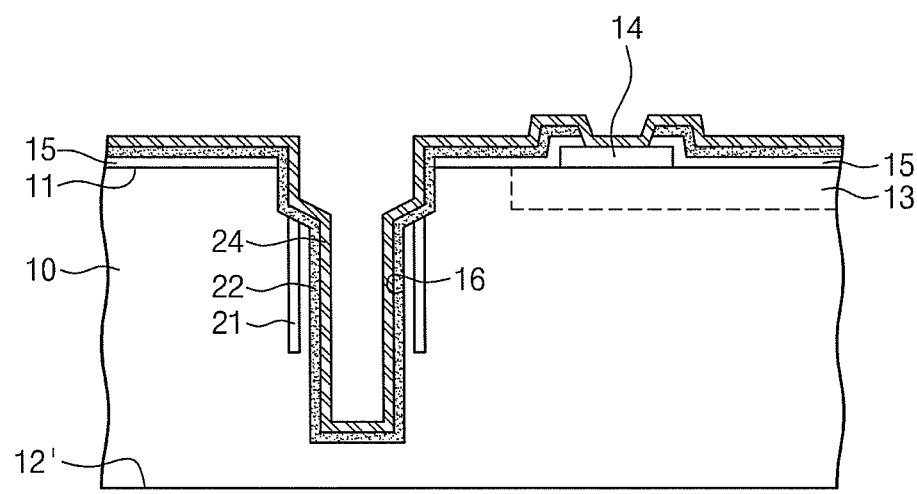

Referring to FIG. 8F, a barrier film 24 may be formed along an inner surface of the via hole 16 on which the via hole insulating film 22 is formed. The barrier film 24 may include for example, titanium (Ti), titanium nitride (TiN), tantalum (Ta), tantalum nitride (TaN), ruthenium (Ru), cobalt (Co), manganese (Mn), tungsten nitride (WN), nickel (Ni), nickel boride (NiB) or a double film of titanium/titanium nitride. The barrier film 24 may prevent metal of a conductive pattern for a through silicon via from diffusing into the substrate 10.

Figure 8G:
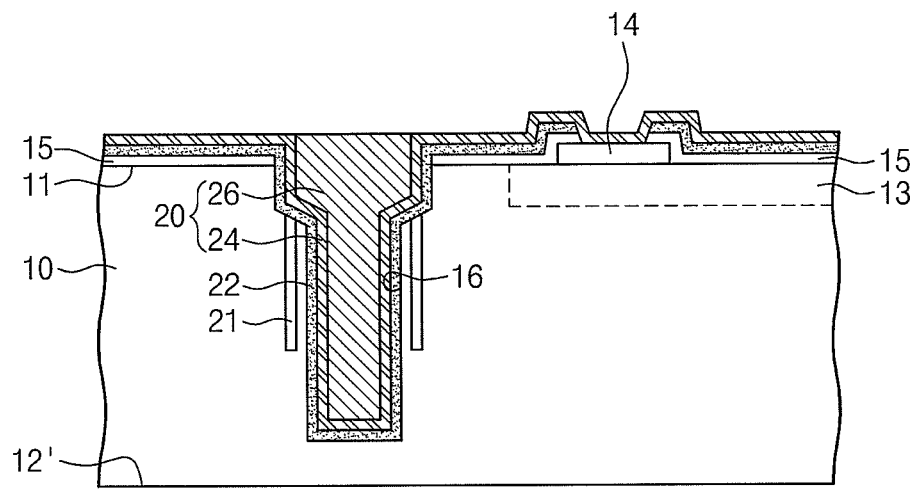
Figure 8H:
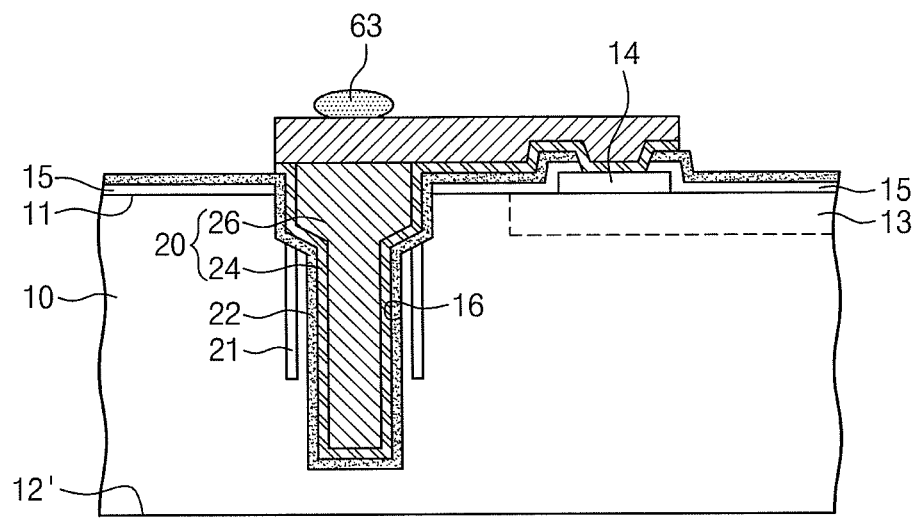

Referring to FIGS. 8G and 8H, the inside of the via hole 16 is filled with an interconnection pattern for a through silicon via, and then a conductive film 26 is formed by patterning the interconnection pattern. The conductive film 26 may be formed inside the via hole 16 using, for example, an electroplating method, an electroless plating method or a selective deposition method. The electroplating method may include forming a seed layer inside the via hole 16 in which the barrier film 24 is formed and plating the interconnection pattern using the seed layer. The seed layer may be formed by, for example, a sputtering method. The conductive film 26 may include, for example, silver, gold, copper, tungsten or indium. A conductive interconnection 27 extending on the first surface 11 of the substrate 10 and contacting the conductive film 26 may be formed to electrically connect the conductive film 26 to the pad 14. The conductive film 26 and the conductive interconnection 27 may be formed by respective processes or by one damascene process. The conductive film 26 may be formed to penetrate the pad 14 or overlap the pad 14.

According to embodiments of the inventive concept, by having a structure of a through silicon via including the air gap 21 while not reducing an area contacting the metal interconnection, a structure of a through silicon via may be realized such that a contact resistance and capacitance between the through silicon vias may be lowered. Accordingly, electrical characteristics and reliability of semiconductor devices may be improved.

A portion of the barrier film 24 formed outside the conductive interconnection 27 may be removed using the conductive interconnection 27 as a mask. A removal of the barrier film 24 may be performed using, for example, dry etching or wet etching. A connection pattern 63 may be formed on the conductive interconnection 27. The connection pattern 63 may include a solder ball.

Figure 8I:
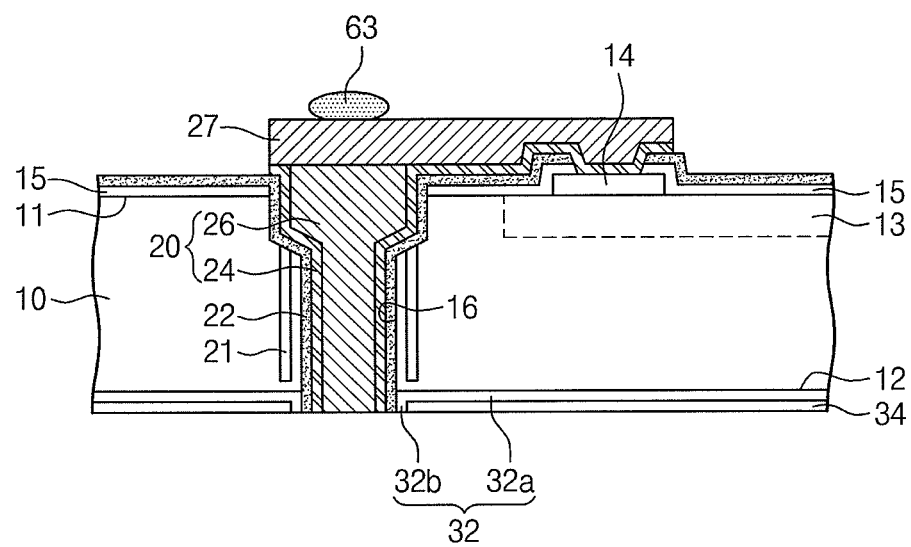

Referring to FIG. 8I, polishing the initial second surface 12' of the substrate 10 is performed. First, a carrier substrate (not shown) may be attached to the first surface 11 of the substrate 10 using an adhesion layer (not shown). The carrier substrate may alleviate mechanical stress applied to the substrate 10 while polishing the initial second surface 12' of the substrate 10 and may prevent bending of the thinned substrate 10 after the polishing process. The carrier substrate may include a glass substrate or a resin substrate and the adhesion layer may include an ultraviolet adhesive or a thermoplastic adhesive. The initial second surface 12' of the substrate 10 may be polished so that the via hole insulating film 22 is exposed. The initial second surface 12' of the substrate 10 is polished using, for example, a grinding method. A polished second surface of the substrate 10 may be higher or lower than the via hole insulating film 22.

The polished second surface of the substrate 10 is selectively etched so that the conductive film 26 surrounded by the via hole insulating film 22 protrudes from a second surface 12 of the substrate 10. The substrate 10 may be selectively etched using, for example, a dry etching process or a wet etching process having a high etch selectivity with respect to the via hole insulating film 22. For example, in the case that the via hole insulating film 22 is a silicon oxide film, the substrate 10 may be selectively etched using a $SF_6$ etching gas. A thickness of the substrate 10 that is etched may be equal to or greater than the sum of thicknesses of first and second sub insulating films (32, 34 of FIGS. 1 through 7) and the via hole insulating film 22. In the case that the barrier film 24 is formed, a thickness of the substrate 10 that is etched may be equal to or greater than the sum of thicknesses of first and second sub insulating films (32, 34 of FIGS. 1 through 7), the via hole insulating film 22 and the barrier film 24.

First and second sub insulating films 32 and 34 are sequentially formed on the second surface 12 of the substrate 10. The first sub insulating film 32 may be, for example, a silicon oxide film. The second sub insulating film 34 may be, for example, a silicon nitride film. Since the carrier substrate is attached to the first surface 11 of the substrate 10 by the adhesion layer, the first and second sub insulating films 32 and 34 may be formed using a chemical vapor deposition (CVD) process at a low temperature of about 300° C. or less considering a thermal stability of the adhesion layer.

Referring back to FIG. 1, a planarization process is performed using the second sub insulating film 34 as a planarization stop layer. The planarization process may be performed using, for example, a chemical mechanical polishing (CMP). Portions of the second sub insulating film 34, the first sub insulating film 32, the via hole insulating films 22, the barrier film 24 and the conductive film 26 that are disposed on the second surface 12 of the substrate 10 and protrude farther than the second sub insulating film 34 are removed by the planarization process. As the conductive film 26 is exposed, the conductive film 26 may be connected to another through silicon via. After the planarization process, the carrier substrate and the adhesion layer may be removed. The planarization process may be performed so that the barrier film 24, when necessary, remains on an upper portion of the conductive film 26 without being removed.

Although not illustrated in the drawing, according to an embodiment, the remaining second sub insulating film 34 may be removed. The second sub insulating film 34 may be removed using a wet etching process or a dry etching process having a high etch selectivity with respect to the first sub insulating film 32. In particular, in the case that the second sub insulating film 34 is a silicon nitride film, the second sub insulating film 34 may be removed to reduce a stress applied to the substrate 10.

In some embodiments of the inventive concept, a photolithography process for removing insulating films formed on the conductive film 26 may be omitted by exposing the conductive film 26 through the planarization process using the second sub insulating film 34 as a planarization stop layer. When exposing the conductive film 26 using a photolithography process, if the conductive film 26 has a small enough width (i.e., if the via hole 16 has a small enough width), the first and second sub insulating films 32 and 34 may not be easily removed due to a resolution limit of a photolithography process. However, according to embodiments of the inventive concept, when using the planarization process, the conductive film 26 may be easily exposed regardless of a width of the conductive film 26.

According to some embodiments of the inventive concept, although the conductive film 26 is exposed during a planarization process, since the second surface 12 of the substrate 10 is covered with the first and second sub insulating films 32 and 34, contamination of the substrate 10 caused by metal material may be prevented.

A method of manufacturing a semiconductor device in accordance with another embodiment of the inventive concept is described below. FIGS. 9A through 9J are cross sectional views illustrating a method of manufacturing a semiconductor device in accordance with another embodiment of the inventive concept. Same or similar elements of the embodiments of the inventive concept may use same reference numerals in the drawings and repetitive descriptions may be omitted.

Figure 9A:
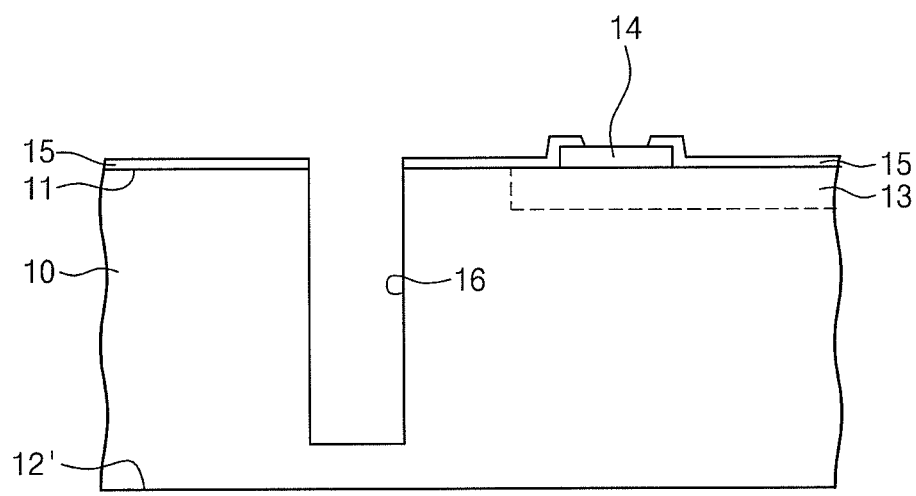
FIGS. 9A through 9J are cross sectional views illustrating a method of manufacturing a semiconductor device in accordance with another embodiment of the inventive concept.

Referring to FIG. 9A, a first hole 16 recessed to a predetermined depth from a first surface 11 of a substrate 10 is formed. Since the depth of the first hole 16 is greater than a thickness of an integrated circuit 13 and smaller than a thickness of the substrate 10, the first hole 16 may be spaced apart from an initial second surface 12' of the substrate 10.

The first hole 16 may be formed by forming a first mask pattern (not illustrated) exposing a first hole region on the first surface 11 of the substrate 10, and then etching the substrate 10 using the first mask pattern as an etching mask.

Figure 9B:
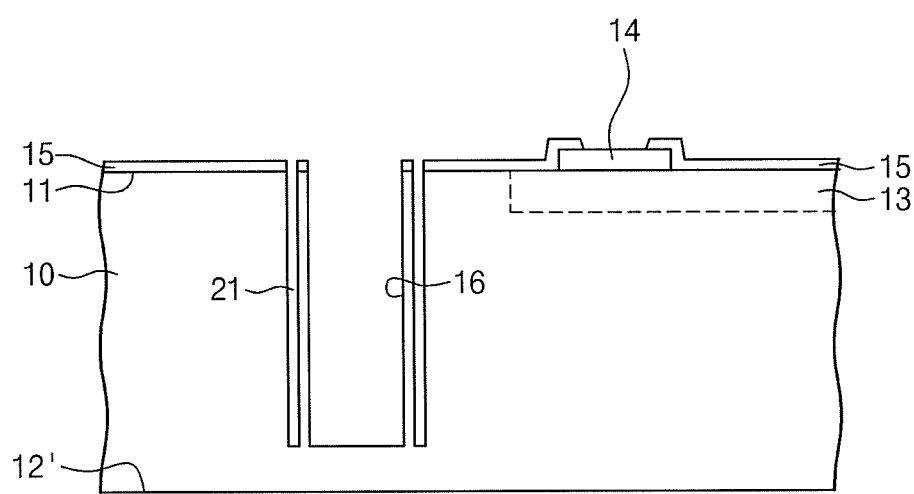

Referring to FIG. 9B, a second hole 21 which is recessed to a predetermined depth from the first surface 11 of the substrate 10 and surrounds the first hole 16 is formed. A plurality of second holes 21 may be formed. A portion of the substrate 10 may be interposed between the second holes 21 when there are the plurality of second holes 21. In addition, a portion of the substrate 10 may be disposed between the second hole 21 and the first hole 16. The second hole 21 may be formed in a peripheral circuit region or a scribe lane like the first hole 16. According to an embodiment, the second hole 21 may be formed to penetrate a pad 14 or overlap the pad 14. Since the depth of the second hole 21 is greater than a thickness of the integrated circuit 13 and smaller than a thickness of the substrate 10, the second hole 21 may be spaced apart from an initial second surface 12' of the substrate 10.

The second hole 21 may be formed by forming a second mask pattern (not illustrated) exposing a second hole region on the first surface 11 of the substrate 10, and then etching the substrate 10 using the second mask pattern as an etching mask. The first and second holes 16 and 21 are formed by the respective etching processes to have a same depth.

Figure 9C:
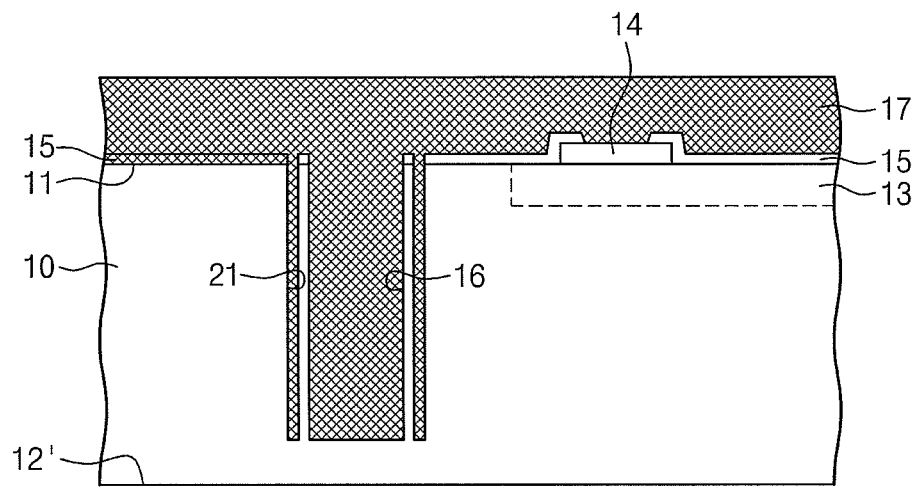
Figure 9D:
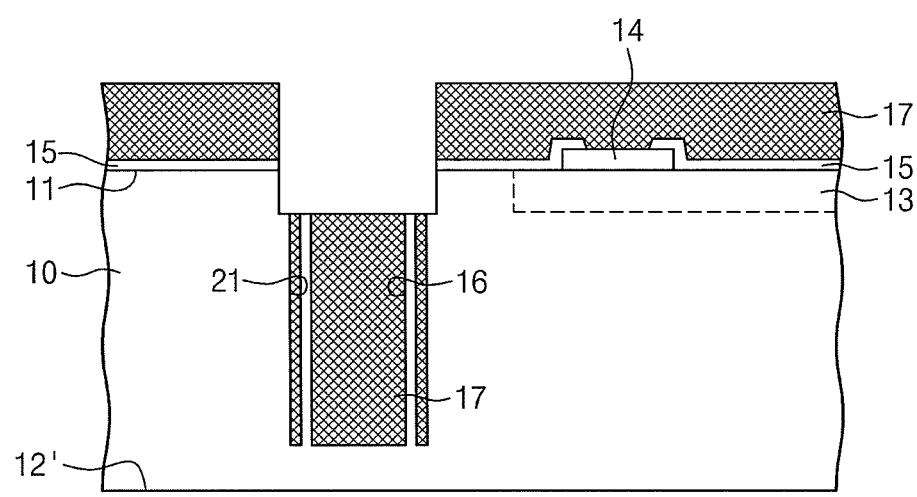
Figure 9E:
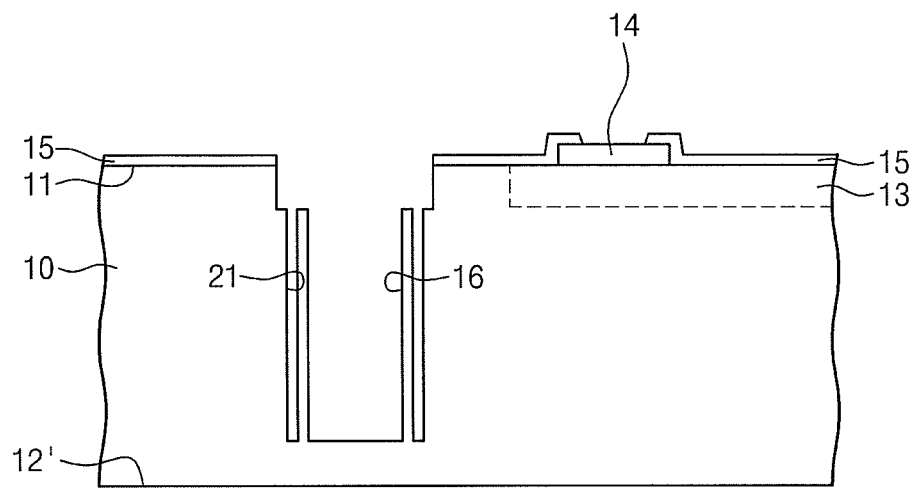
Figure 9F:
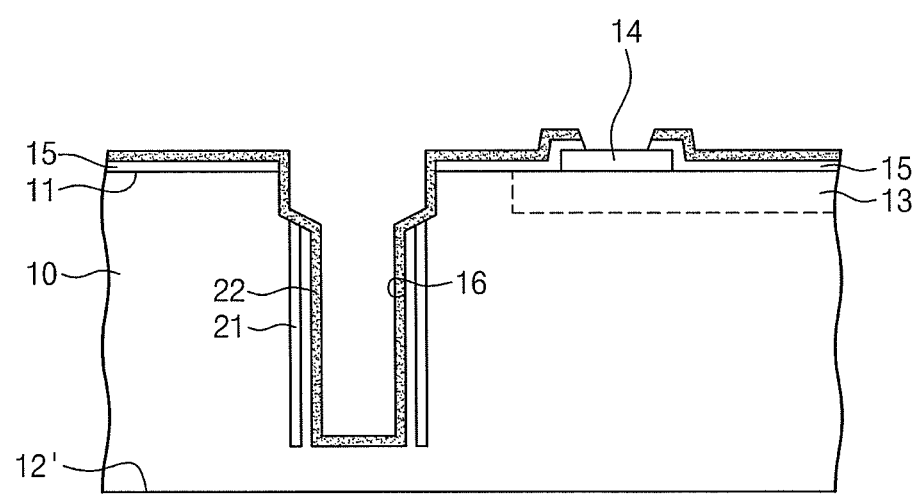
Figure 9G:
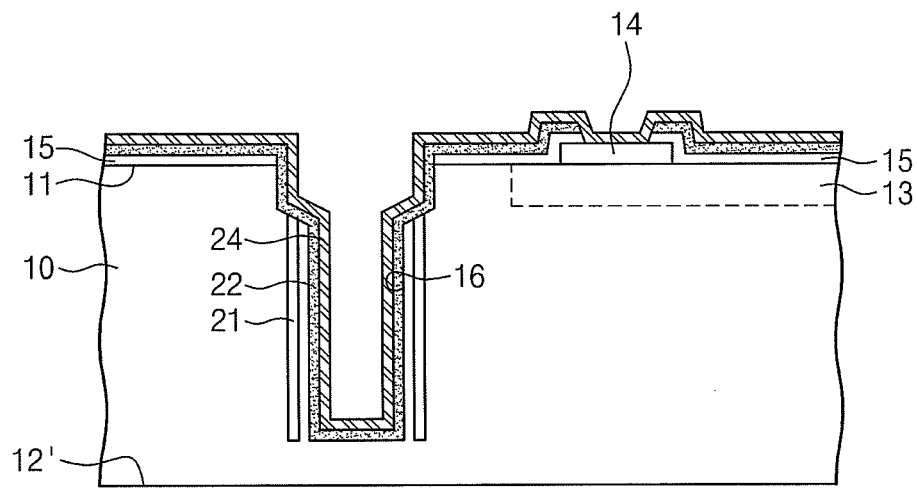
Figure 9H:
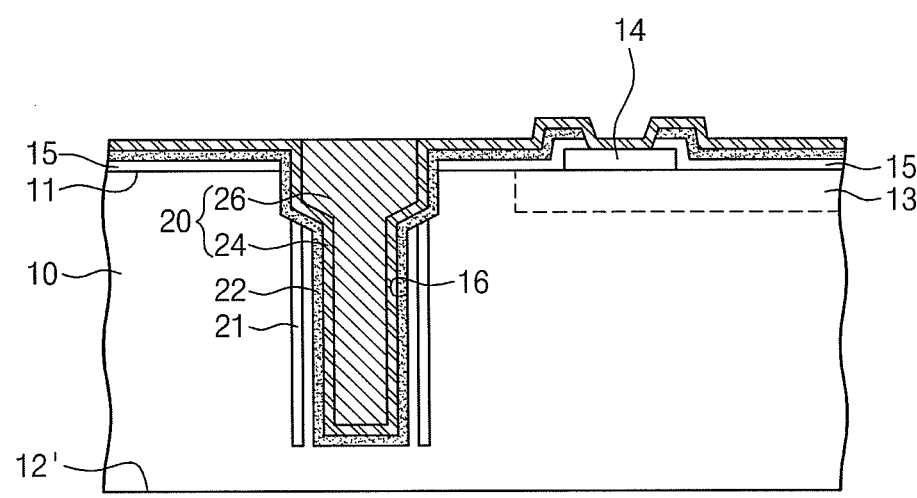

Referring to FIGS. 9C through 9E, using the method described with reference to FIGS. 8B through 8D, a gap fill material 17 filling the first and second holes 16 and 21 is formed, and a third mask pattern (not illustrated) exposing a region including the first and second holes 16 and 21 is formed on the first surface 11 of the substrate 10 including the gap fill material 17. The gap fill material 17 and a portion of the substrate 10 between the first hole 16 and the second hole 21 are recessed by an etching process using the third mask pattern as an etching mask, the third mask pattern is removed and the remaining gap fill material 17 is removed.

As a result, a via hole 16 and an air gap 21 may be formed. The via hole 16 includes a first region having a first width and a second region having a second width greater than the first width. The air gap 21 is disposed under the second region of the via hole 16 and surrounds the entire first region of the via hole 16.

Referring to FIGS. 9F through 9J, using the method described with reference to FIGS. 8E through 8I, a via hole insulating film 22, a barrier insulating film 24, a conductive film 26, a conductive interconnection 27, a connection pattern 63 and first and second sub insulating films 32 and 34 are formed. A planarization process may be performed using the second sub insulating film 34 as a planarization stop layer to form the semiconductor device 107 shown in FIG. 6.

Figure 9I:
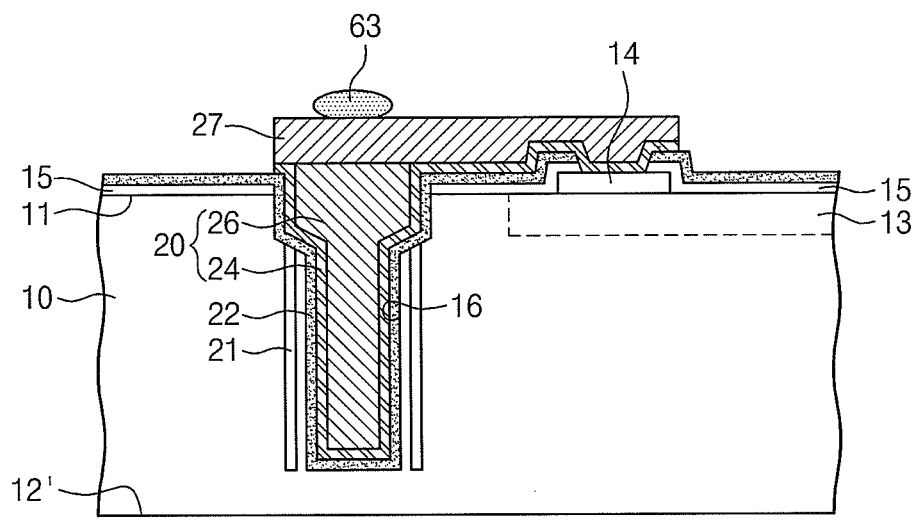
Figure 9J:
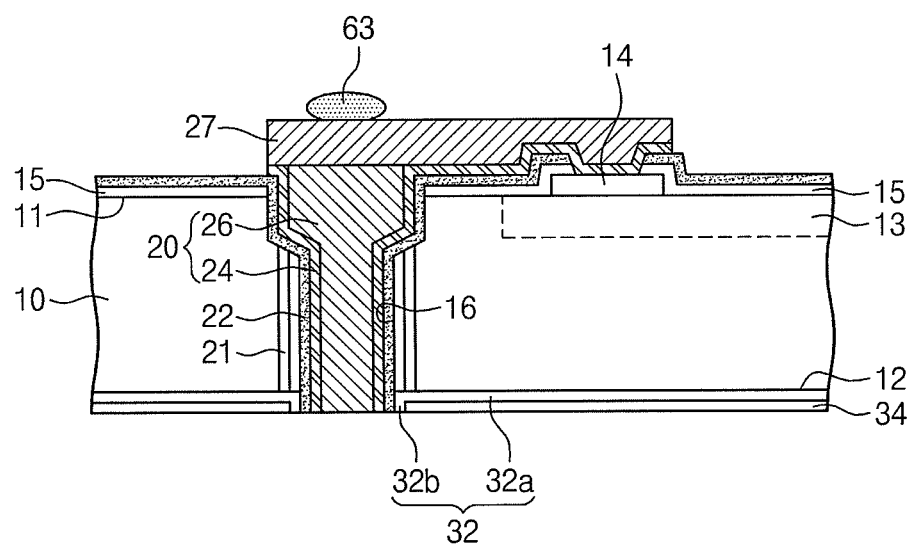

Also, if the conductive film 26 is polished while excessively polishing the initial second surface 12' of the substrate 10 in FIG. 9I, a resultant structure like FIG. 6 may be formed.

According to embodiments of the inventive concept, by having a structure of a through silicon via including an air gap while not reducing an area contacting a metal interconnection, a structure of a through silicon via may be realized such that a capacitance between the through silicon vias and a contact resistance may be lowered. Thus, semiconductor devices having improved electrical characteristics and improved reliability may be provided.

Figure 10:
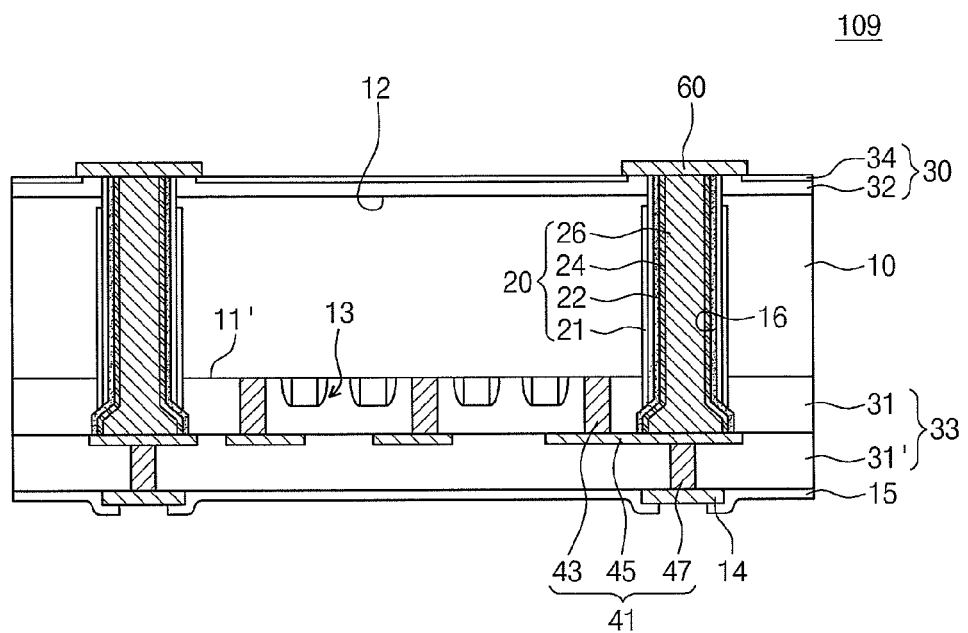
FIG. 10 is a cross sectional view of a semiconductor device in accordance with another embodiment of the inventive concept.

FIG. 10 is a cross sectional view of a semiconductor device 109 in accordance with another embodiment of the inventive concept.

Referring to FIG. 10, a semiconductor substrate 10 is provided. For example, the semiconductor substrate 10 may be, for example, a silicon substrate. The semiconductor substrate 10 may include a first surface 11' and a second surface 12 opposite the first surface 11'. The semiconductor device 109 may include an integrated circuit 13 formed on the first surface 11' of the semiconductor substrate 10. The integrated circuit 13 may vary depending on the type of the semiconductor device 109. For example, the integrated circuit 13 may include at least one of a memory circuit, a logic circuit and combinations thereof. The integrated circuit 13 may be a passive device including a resistor or a capacitor.

A via hole 16 which is spaced apart from the integrated circuit 13 and penetrates the semiconductor substrate 10 is provided. The via hole 16 may have a same diameter from the first surface 11' to the second surface 12. According to an embodiment, the via hole 16 may have two or more diameters of different sizes. According to an embodiment, the via hole 16 may have a tapered shape such that a diameter thereof is gradually changed.

A through silicon via 20 may fill at least a portion of the via hole 16. The through silicon via 20 may be connected to the integrated circuit 13 of the semiconductor device 109. According to embodiments, the through silicon via 20 may also connect the semiconductor device 109 to another semiconductor device, and/or connect the semiconductor device 109 to a package substrate or a module substrate. The through silicon via 20 may include a barrier film 24 formed on an inner sidewall of the via hole 16 and a conductive film 26 formed on the barrier film 24. The conductive film 26 may fill at least a portion of the via hole 16. According to an embodiment, the conductive film 26 may include a raised portion protruding from the second surface 12 of the semiconductor substrate 10. A via hole insulating film 22 may be provided between the semiconductor substrate 10 and the barrier film 24. The via hole insulating film 22 may have the structure described with reference to FIGS. 1 through 7. The via hole insulating film 22 may include, for example, silicon oxide, silicon oxynitride, silicon nitride, polymer or combinations thereof. The polymer may be a CF-based polymer. The CF-based polymer may be formed by a plasma process using at least one selected from $C_4F_6$, $C_4F_8$, $C_5F_8$, $CHF_3$ and combinations thereof. The barrier film 24 may be formed of material that prevents conductive material of the conductive film 26 from diffusing into the semiconductor substrate 10. For example, the barrier film 24 may include titanium (Ti), titanium nitride (TiN), tantalum (Ta), tantalum nitride (TaN), ruthenium (Ru), cobalt (Co), manganese (Mn), tungsten nitride (WN), nickel (Ni), nickel boride (NiB) or a double film of titanium/titanium nitride. According to an embodiment, the barrier film 24 may be formed using a sputtering method. The conductive film 26 may include copper, tungsten, aluminum, silver, gold, indium or polysilicon.

A surface insulating film 30 may be provided on the second surface 12 of the semiconductor substrate 10. The surface insulating film 30 may extend from the second surface 12 of the semiconductor substrate 10 to a sidewall of the via hole 16. The surface insulating film 30 may include, for example, silicon oxide, silicon nitride or silicon oxynitride. For example, the surface insulating film 30 may include a first sub insulating film 32 on the second surface 12 of the semiconductor substrate 10 and a second sub insulating film 34 on the first sub insulating film 32. The first sub insulating film 32 may be, for example, a silicon oxide film and the second sub insulating film 34 may be, for example, a silicon nitride film.

A connection pad 60 covering the conductive film 26 and at least a portion of the surface insulating film 30 may be provided on the second surface 12 of the semiconductor substrate 10. The connection pad 60 may be directly connected to the raised portion of the conductive film 26.

An interlayer insulating film 33 covering the first surface 11' of the semiconductor substrate 10 and the integrated circuit 13 and an inner interconnection 41 connecting the integrated circuit 13 and the pad 14 may be provided. The interlayer insulating film 33 may include a plurality of insulating films. For example, the interlayer insulating film 33 may include a first interlayer insulating film 31 covering the first surface 11' of the semiconductor substrate 10 and a second interlayer insulating film 31' formed on the first interlayer insulating film 31 and covering the integrated circuit 13. A passivation film 15 including an opening exposing a portion of the pad 14 may be provided on the interlayer insulating film 33. The inner interconnection 41 may include first and second contact plugs 43 and 47 penetrating at least a portion of the interlayer insulating film 33 and a first interconnection pattern 45 formed on or in the interlayer insulating film 33. For example, the first interconnection pattern 45 may be a first metal layer. The first and second contact plugs 43 and 47 and the first interconnection pattern 45 may be formed using a patterning method or a damascene method.

According to an embodiment, the semiconductor device 109 may be a semiconductor chip having a via middle structure such that the through silicon via 20 is formed after the integrated circuit 13 is formed. For example, after the integrated circuit 13, the first interlayer insulating film 31 and the first contact plug 43 are formed on the first surface 11' of the semiconductor substrate 10, the through silicon via 20, penetrating the semiconductor substrate 10 and the first interlayer insulating film 31, is formed. After the through silicon via 20 is formed, the first interconnection pattern 45 connecting the first contact plug 43 and the conductive film 26, the second contact plug 47 and the pad 14 may be formed.

The through silicon via 20 in accordance with the embodiments described with reference to FIGS. 1 through 7 may be applied to an interposer (120 of FIG. 11). In this case, the integrated circuit 13 described in FIG. 10 may not be formed.

Figure 11:
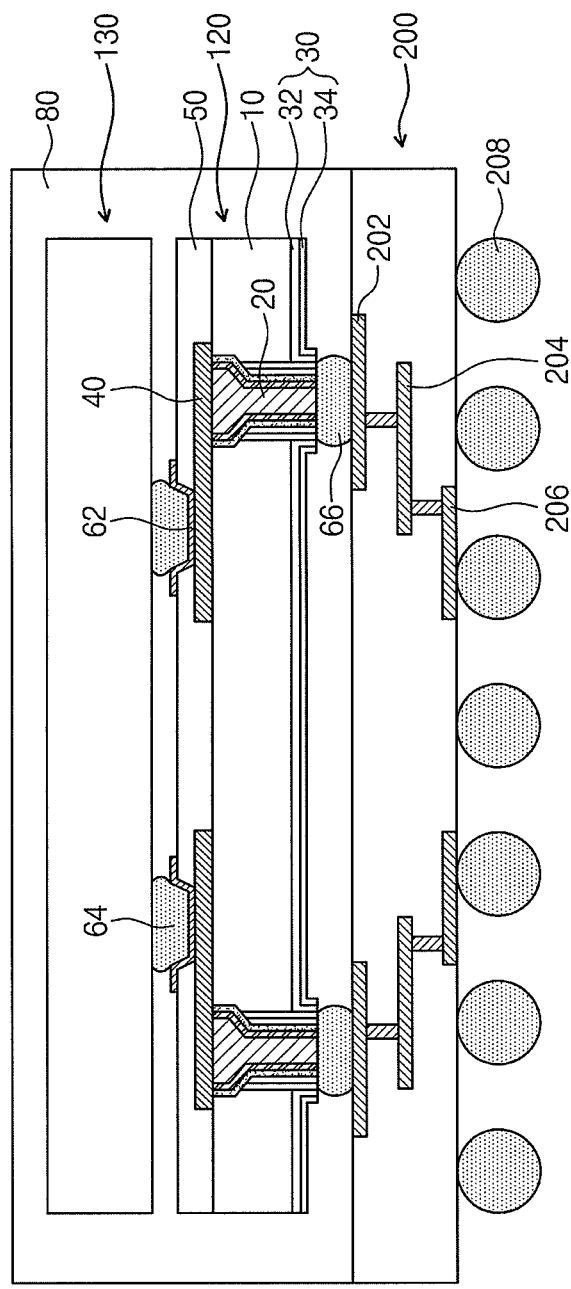
FIG. 11 is a cross sectional view of a semiconductor package including an interposer in accordance with embodiments of the inventive concept.

FIG. 11 is a cross sectional view illustrating an interposer in accordance with embodiments of the inventive concept.

Referring to FIG. 11, a semiconductor substrate 10 may be, for example, a silicon substrate or a glass substrate. A second connection terminal 66 may be formed on the second surface 12 of the semiconductor substrate 10. The second connection terminal 66 may be, for example, a conductive bump, a solder ball, a conductive spacer, a pin grid array (PGA) or combinations thereof.

An interconnection layer 40 electrically connected to the through silicon via 20 and an insulating film 50 covering the interconnection layer 40 may be formed on the first surface 11' of the semiconductor substrate 10. According to an embodiment, the interconnection layer 40 may be a redistributed interconnection for another semiconductor device stacked on an interposer 120. An opening in the insulating film 50 may expose a portion of the interconnection layer 40. An electrode pad 62 is electrically connected to the exposed portion of the interconnection layer 40. In the case that a plurality of electrode pads 62 and a plurality of second connection terminals 66 are provided, the electrode pads 62 and the second connection terminals 66 may have different pitches from each other.

According to an embodiment, the interposer 120 may be upside down mounted on a package substrate 200. The package substrate 200 may be formed of, for example, a flexible printed circuit board and a rigid printed circuit board with a circuit pattern 204 formed therein or combinations thereof. The circuit pattern 204 may be connected to, for example, a bonding pad 202 and/or a ball pad 206, which is exposed to the outside.

The interposer 120 may be electrically connected to the bonding pad 202 through the second connection terminal 66 and may be connected to an external connection terminal 208 through the circuit pattern 204 of the package substrate 200.

According to an embodiment, another semiconductor device 130 may be stacked on the interposer 120. The semiconductor device 130 may be electrically connected to the electrode pad 62 of the interposer 120 through a first connection terminal 64. For example, the semiconductor device 130 may be a semiconductor chip and the first connection terminal 64 may be a flip chip bump. In the case that a plurality of the first connection terminals 64 and a plurality of the through silicon vias 20 are formed, a space between the first connection terminals 64 may be smaller than a space between through silicon vias 20. In the case that the semiconductor device 130 cannot be directly connected to the bonding pad 202 of the package substrate 200 because the space between the first connection terminals 64 is small, the interposer 120 including the interconnection layer 40 may be disposed between the semiconductor device 130 and the package substrate 200.

According to an embodiment, a protection member 80 covering a portion of or the whole package substrate 200, the interposer 120 and the semiconductor device 130 may further be included. For example, the protection member 80 may be an underfill filling at least a portion of a space between the interposer 120 and the package substrate 200 or a space between the interposer 120 and the semiconductor device 130 or may be a molding structure covering the interposer 120 and the semiconductor device 130. The molding structure may include, for example, epoxy molding compound (EMC).

Figure 12:
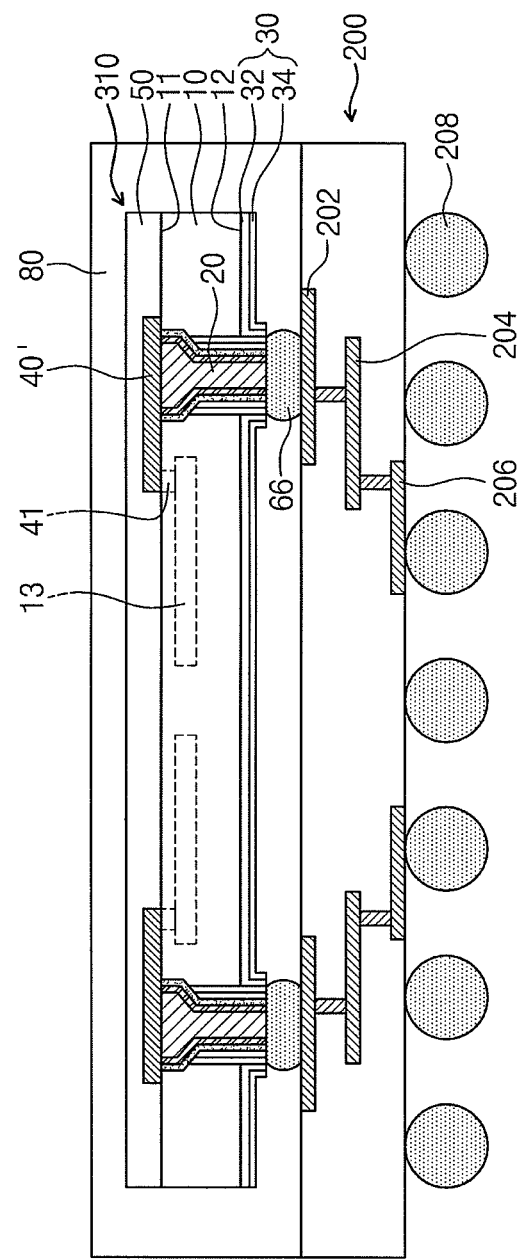
FIGS. 12 and 13 are cross sectional views of a semiconductor package in accordance with embodiments of the inventive concept.
Figure 13:
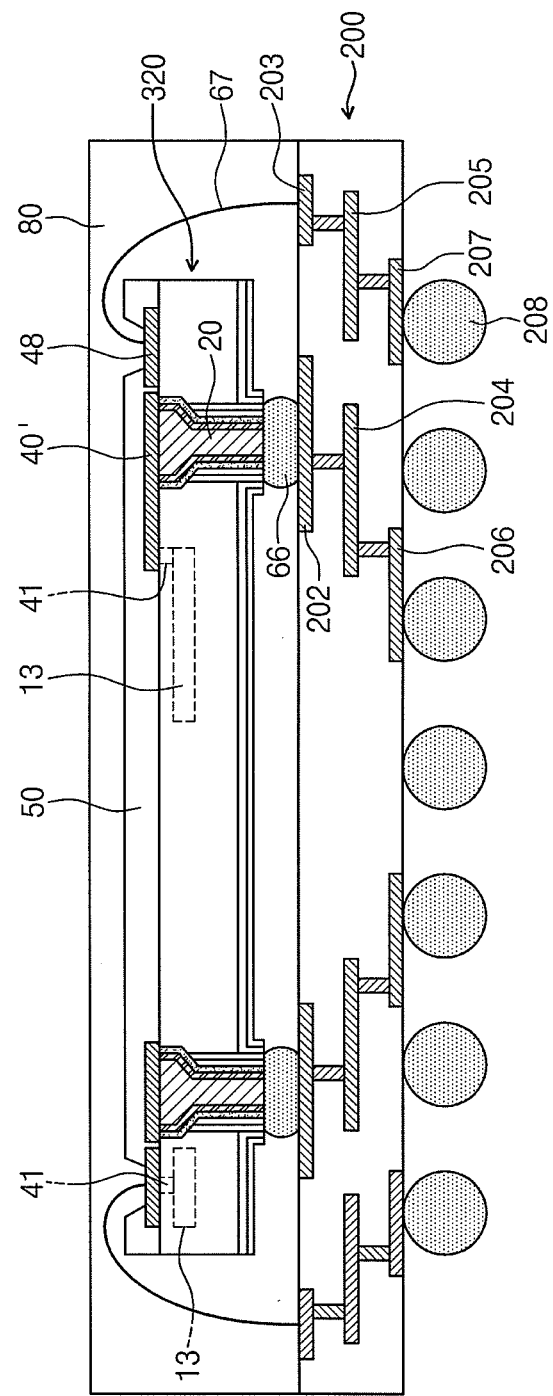

FIGS. 12 and 13 are cross sectional views of a semiconductor package in accordance with embodiments of the inventive concept.

Referring to FIG. 12, a semiconductor chip 310 may include an integrated circuit 13 formed in a semiconductor substrate 10 or on a first surface 11 of the semiconductor substrate 10. The integrated circuit 13 may be electrically connected to a through silicon via 20 through an internal interconnection 41 and a first interconnection layer 40'. An insulating film 50 may be formed on the first interconnection layer 40'. According to an embodiment, the first interconnection layer 40' and the insulating film 50 may have the same structure as described with reference to FIG. 10.

A package substrate 200 may be formed of a flexible printed circuit board and a rigid printed circuit board with a circuit pattern 204 formed therein or combinations thereof. The package substrate 200 may include a bonding pad 202 and a ball pad 206 exposed to the outside at opposite surfaces of the package substrate 200. The circuit pattern 204 may be connected to the bonding pad 202 and/or the ball pad 206. The semiconductor chip 310 may be mounted on the package substrate 200 so that a second surface 12 of the semiconductor substrate 10 faces the package substrate 200. The semiconductor chip 310 may be electrically connected to the bonding pad 202 through a second connection terminal 66 and may be connected to an external connection terminal 208 through the circuit pattern 204 and the ball pad 206 of the package substrate 200.

The insulating film 50 may be formed to have an opening that exposes a part of the first interconnection layer 40' and the exposed part of the first interconnection layer 40' may be electrically connected to the circuit pattern 204 of the package substrate 200 through a connection terminal (not illustrated).

Referring to FIG. 13, a modified embodiment of the semiconductor package described with reference to FIG. 12 is described. A package substrate 200 may include a second circuit pattern 205 formed in the package substrate 200, and a second bonding pad 203 and a second ball pad 207 that are exposed to the outside at opposite surfaces of the package substrate 200. The second circuit pattern 205 may be connected to the second bonding pad 203 and/or the second ball pad 207.

One portion of an integrated circuit 13 of a semiconductor chip 320 may be electrically connected to a through silicon via 20 through an internal interconnection 41 and a first interconnection layer 40'. The other portion of the integrated circuit 13 of the semiconductor chip 320 may be electrically connected to a bonding wire 67 through the internal interconnection 41 and a second interconnection layer 48. The first and second interconnection layers 40' and 48 and the insulating film 50 may have the same structure as described with reference to FIG. 10. A portion of the second interconnection layer 48 may be exposed through an opening in the insulating film 50 to be connected to the bonding wire 67. The semiconductor chip 320 may be electrically connected to the second circuit pattern 205 of the package substrate 200 through the bonding wire 67 and may be connected to an external connection terminal 208 through the second ball pad 207.

According to an embodiment, signal transmitted through the through silicon via 20 may be different from a signal transmitted through the bonding wire 67. For example, the through silicon via 20 may transmit a power supply signal or a ground signal and the bonding wire 67 may transmit a data signal. Alternatively, the through silicon via 20 may transmit a data signal and the bonding wire 67 may transmit a power supply signal or a ground signal. Thus, the semiconductor chip 320 may include more signal transmission paths.

Figure 14:
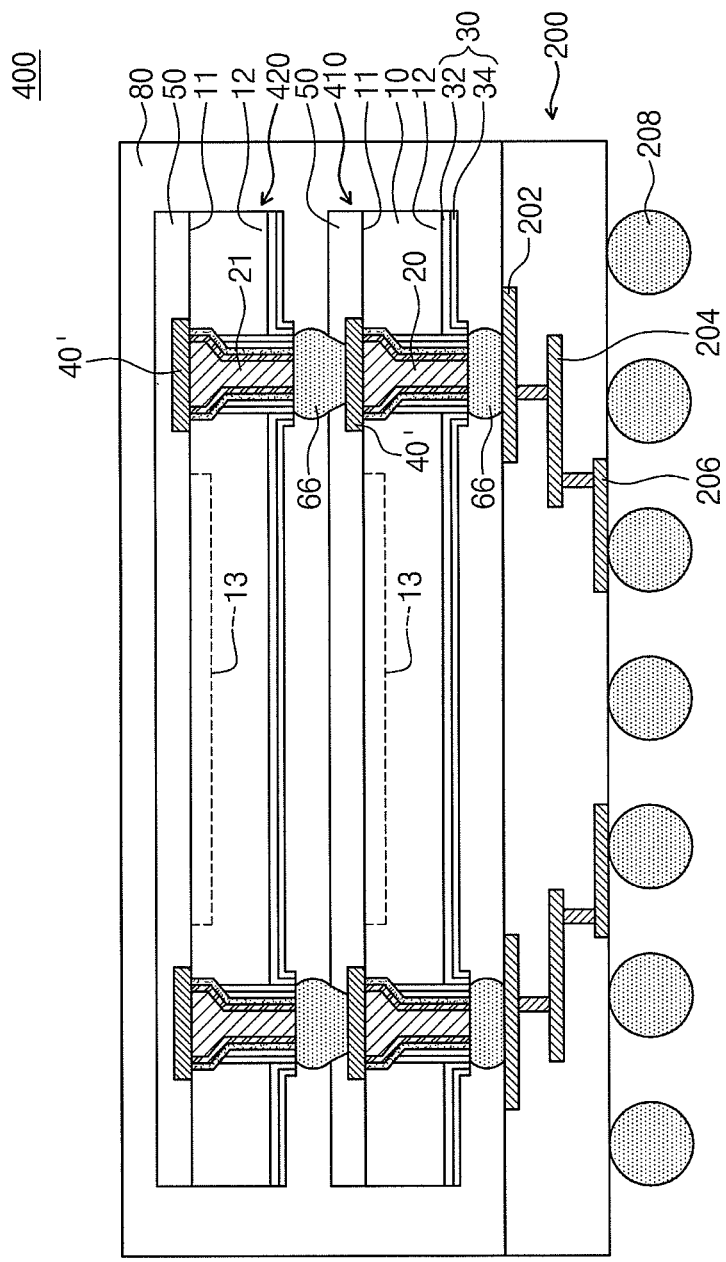
FIGS. 14 through 16 are cross sectional views of a semiconductor package in accordance with embodiments of the inventive concept.
Figure 15:
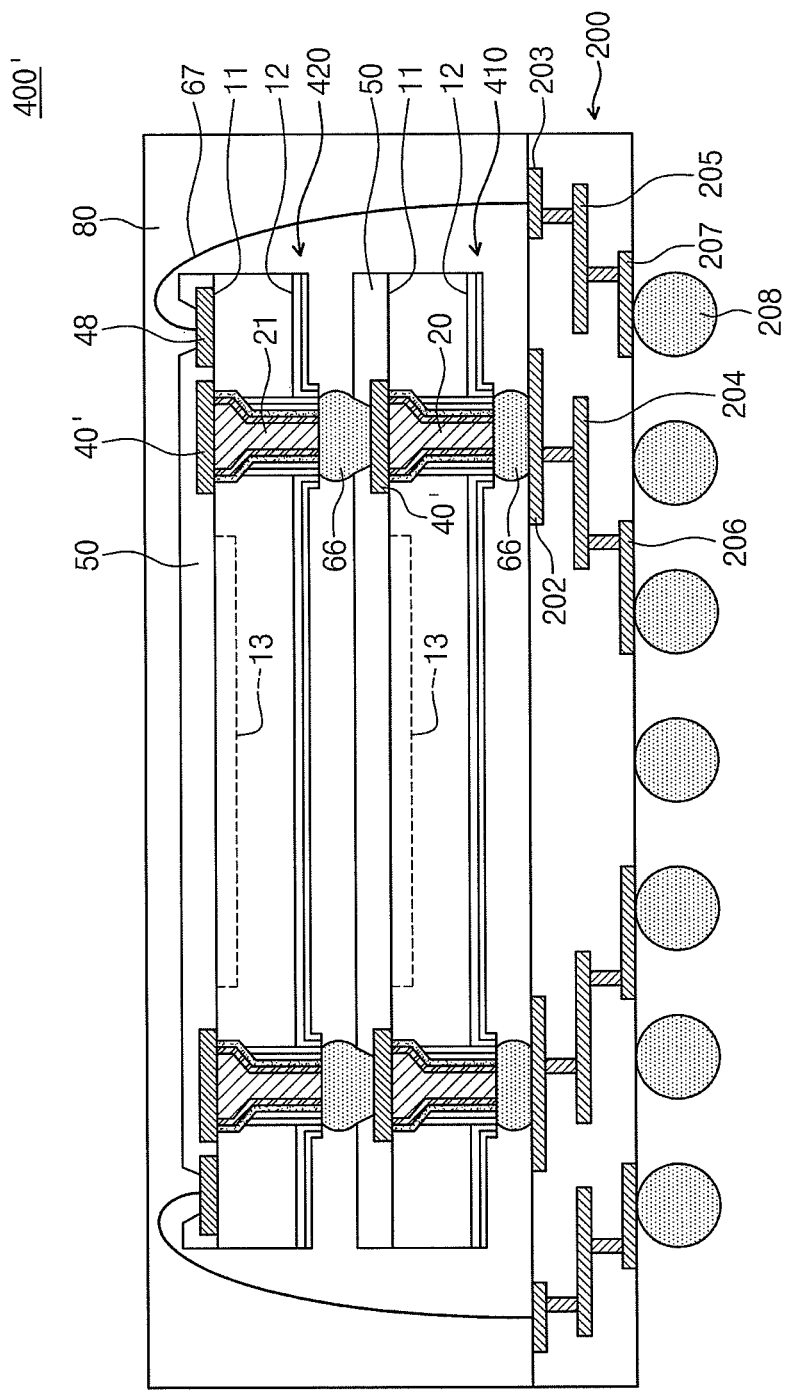
Figure 16:
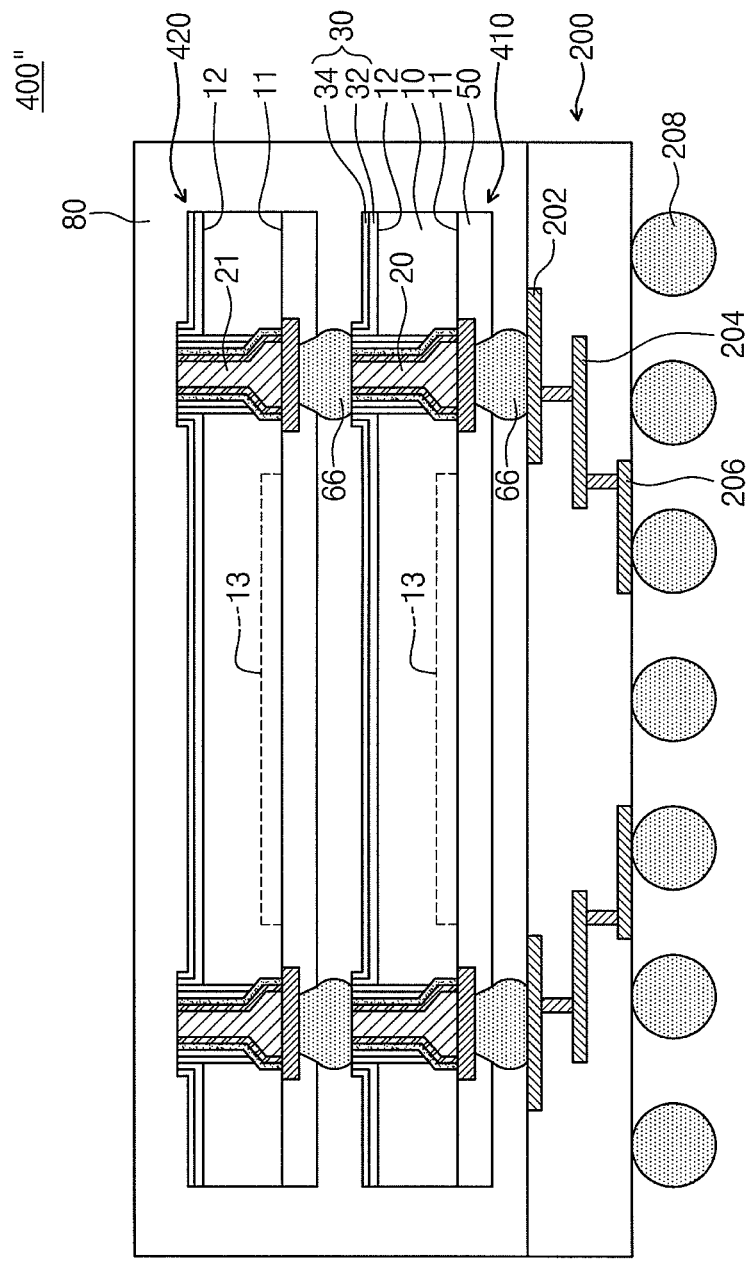

FIGS. 14 through 16 are cross sectional views of a semiconductor package in accordance with embodiments of the inventive concept.

Referring to FIG. 14, a multichip package 400 in accordance with an embodiment of the inventive concept is described. The embodiment described with reference to FIG. 10 may be applied to semiconductor chips 410 and 420 of the multichip package 400. The multichip package 400 may includes a package substrate 200, a first semiconductor chip 410 on the package substrate 200 and at least one second semiconductor chip 420 on the first semiconductor chip 410. The first and second semiconductor chips 410 and 420 may be same kind of semiconductor chips. For example, the first semiconductor chip 410 and the second semiconductor chip 420 may be memory chips formed by a same process. The first and second semiconductor chips 410 and 420 may each include an integrated circuit 13 in which a memory circuit is formed. The first and second semiconductor chips 410 and 420 may include a first through silicon via 20 and a second through silicon via 21, respectively. The first through via 20 and the second through via 21 may be connected and overlapped each other. According to an embodiment, the second through silicon via 21 may directly contact the first through silicon via 20. The first through via 20 and the second through via 21 may be connected to each other through a first interconnection layer 40' and/or a connection terminal 66 therebetween.

Referring to FIG. 15, a semiconductor package 400' in accordance with a modified embodiment of the semiconductor package 400 described with reference to FIG. 14 is described.

A first semiconductor chip 410 and a second semiconductor chip 420 may include a first through silicon via 20 and a second through silicon via 21, respectively. The first and second through silicon vias 20 and 21 may be connected and overlapped each other. One portion of integrated circuit 13 of the second semiconductor chip 420 may be electrically connected to the second through silicon via 21 through an internal interconnection 41 and a first interconnection layer 40'. The other portion of integrated circuit 13 of the second semiconductor chip 420 may be electrically connected to a bonding wire 67 through an internal interconnection 41 and a second interconnection layer 48. The first interconnection layer 40' and an insulating film 50 may have the same structure as described with reference to FIG. 10. A portion of the second interconnection layer 48 may be exposed by an opening in the insulating film 50 to be connected to the bonding wire 67. The second semiconductor chip 420 may be electrically connected to a second circuit pattern 205 of the package substrate 200 through the bonding wire 67.

According to an embodiment, a signal transmitted through the through silicon vias 20 and 21 may be different from a signal transmitted through the bonding wire 67. For example, the through silicon vias 20 and 21 may transmit a power supply signal or a ground signal and the bonding wire 67 may transmit a data signal. Alternatively, the through silicon vias 20 and 21 may transmit a data signal and the bonding wire 67 may transmit a power supply signal or a ground signal. Thus, the semiconductor chips 410 and 420 may have more signal transmission paths.

Referring to FIG. 16, a semiconductor package 400" in accordance with another modified embodiment of the semiconductor package 400 described with reference to FIG. 14 is described. A first semiconductor chip 410 and a second semiconductor chip 420 may be mounted on a package substrate 200 so that a first surface 11 of the semiconductor chip 410 faces the package substrate 200. The first semiconductor chip 410 may be connected to a bonding pad 202 of the package substrate 200 through a connection terminal 66 on the first surface 11 of the first semiconductor chip 410.

Figure 17:
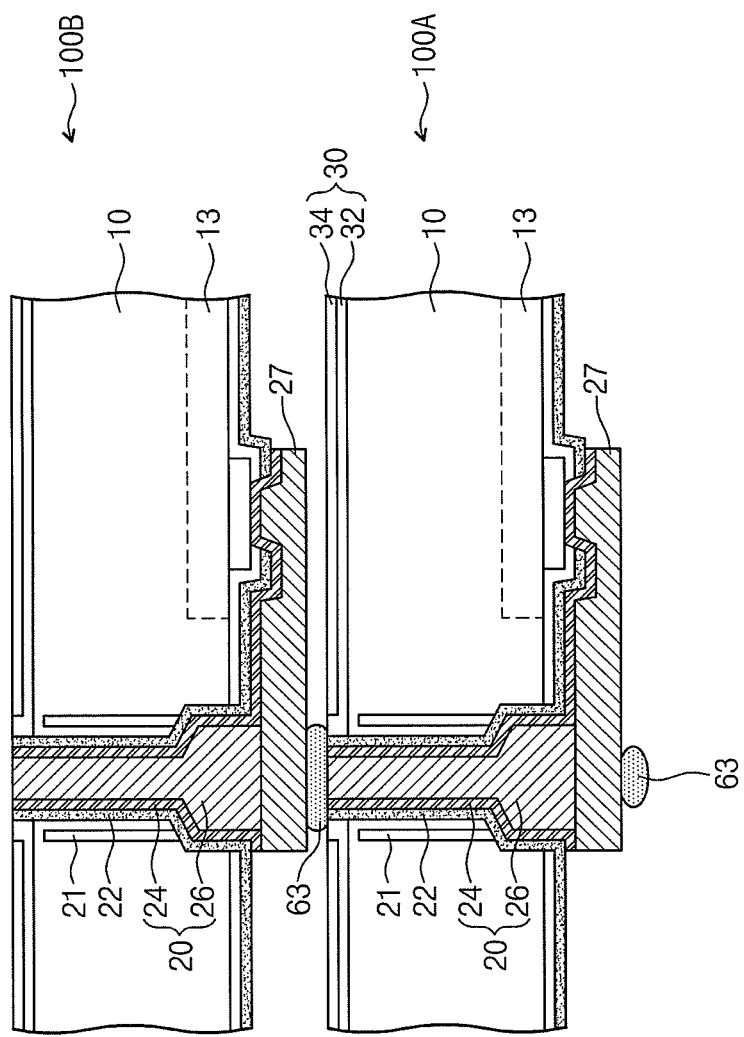
FIG. 17 is a cross sectional view of a semiconductor device in accordance with embodiments of the inventive concept.

FIG. 17 is a cross sectional view of a semiconductor package where semiconductor devices in accordance with embodiments of the inventive concept are stacked.

Referring to FIG. 17, a through silicon via 20 of a first semiconductor device 100A and a through silicon via 20 of a second semiconductor device 100B are stacked to be vertically aligned with each other. The through silicon via 20 of the first semiconductor device 100A and the through silicon via 20 of the second semiconductor device 100B may be adhered to each other through a connection pattern 63. A space between the first semiconductor device 100A and the second semiconductor device 100B may be filled with an insulating filling (not illustrated).

The stacked semiconductor devices may be mounted on the package substrate (200 of FIG. 16). A printed circuit substrate, a tape interconnection substrate, a ceramic interconnection substrate or a silicon interconnection substrate may be used as the package substrate 200. The package substrate 200 may include a second interconnection pattern 204 penetrating an interconnection substrate to extend on one surface of the package substrate 200, a bonding pad 202 which is formed on one surface of the package substrate 200 and electrically connected to the second interconnection pattern 204 and a ball pad 206 which is formed on the other surface of the package substrate 200 and electrically connected to the second interconnection pattern 204. The first and second semiconductor devices 100A and 100B, or a semiconductor device on which the first and second semiconductor devices 100A and 100B are stacked, may be mounted on the package substrate 200 while the connection pattern 63 contacts the bonding pad 202 of the package substrate 200.

Figure 18:
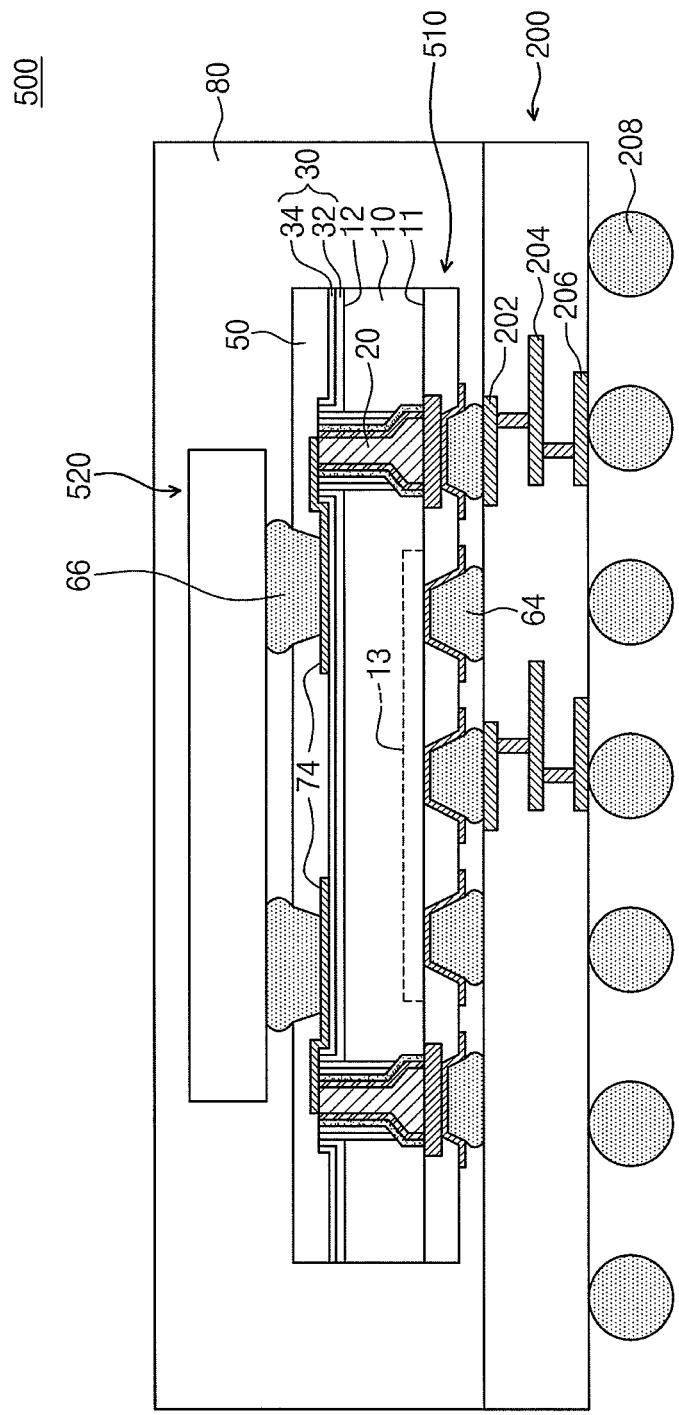
FIGS. 18 and 19 are cross sectional views illustrating a semiconductor package in accordance with embodiments of the inventive concept.
Figure 19:
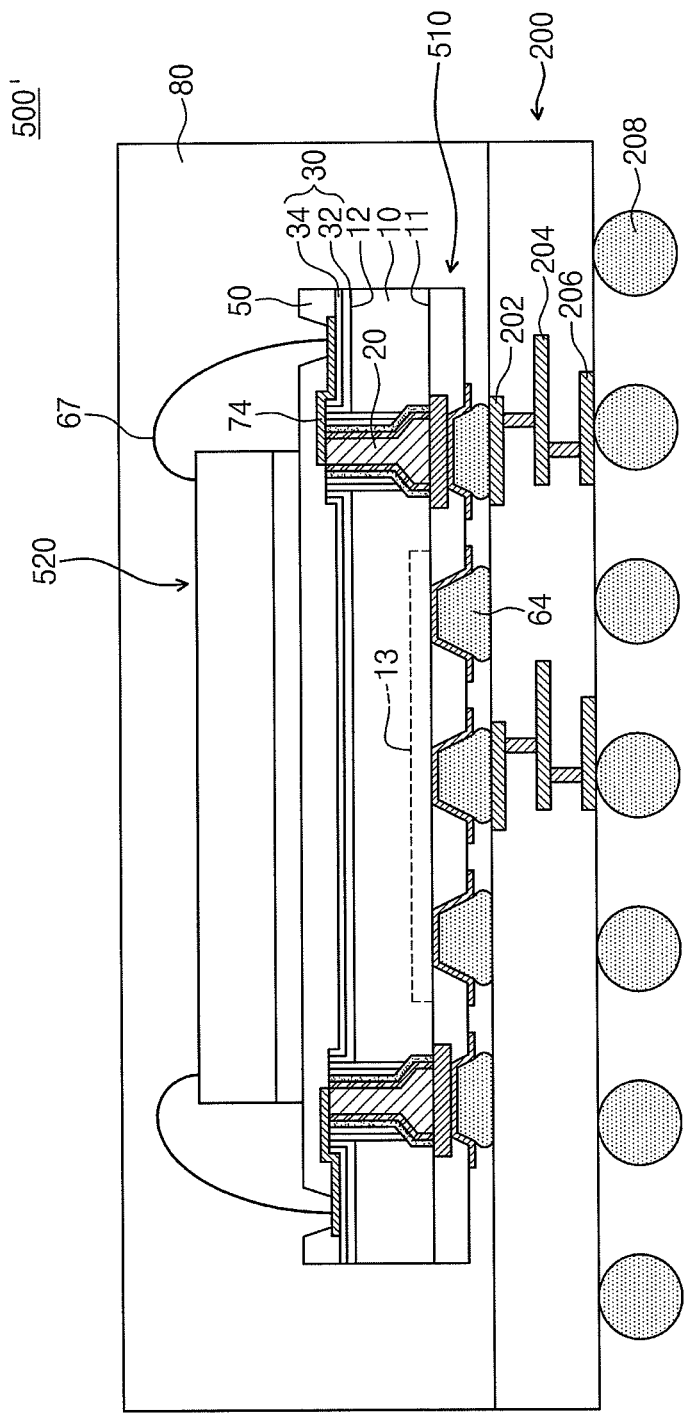

FIGS. 18 and 19 are cross sectional views illustrating a semiconductor package in accordance with embodiments of the inventive concept.

Referring to FIG. 18, a semiconductor package 500 in accordance with the present embodiment may be a system in package 500. The embodiment described with reference to FIG. 10 may be applied to a first semiconductor chip 510 of the system in package 500. A second semiconductor chip 520 may be stacked on the first semiconductor chip 510. According to an embodiment, the second semiconductor chip 520 may be a different semiconductor chip from the first semiconductor chip 510. For example, the first semiconductor chip 510 may include a logic circuit and the second semiconductor chip 520 may include a memory circuit. The second semiconductor chip 520 may be a high performance memory chip to assist an operation of the first semiconductor chip 510.

The first semiconductor chip 510 may be mounted on a package substrate 200 so that a first surface 11 of the first semiconductor chip 510 faces the package substrate 200. A plurality of first connection terminals 64 may be included on the first surface 11 of the first semiconductor chip 510. Some of the first connection terminals 64 may be connected to through silicon vias 20 and some of the first connection terminals 64 may be connected to an integrated circuit 13 formed in the first semiconductor chip 510. The integrated circuit 13 may be directly connected to the package substrate 200 through the first connection terminals 64. The integrated circuit 13 may be connected to the second semiconductor chip 520 through the through silicon vias 20.

The second semiconductor chip 520 may be connected to the package substrate 200 through the through silicon vias 20 and the first connection terminals 64. The second semiconductor chip 520 may be connected to the first semiconductor chip 510 through second connection terminals 66 formed on one surface of the second semiconductor chip 520. The second connection terminal 66 may be a conductive bump, a solder ball, a conductive spacer, a pin grid array or combinations thereof. The second connection terminal 66 and the through silicon via 20 may be connected to each other through a third interconnection pattern 74 for a redistributed interconnection. For example, when a space between the second connection terminals 66 is different from a space between the through silicon vias 20, the second connection terminal 66 and the through silicon via 20 may be connected to each other through the third interconnection pattern 74.

Referring to FIG. 19, a semiconductor package 500' in accordance with a modified embodiment of the semiconductor package 500 described with reference to FIG. 18 is described.

A portion of the third interconnection pattern 74 may be exposed by an opening in an insulating film 50. A second semiconductor chip 520 may be electrically connected to the third interconnection pattern 74 through a bonding wire 67. A first semiconductor chip 510 and the second semiconductor chip 520 may be connected to each other through the bonding wire 67. The bonding wire 67 may be directly connected a through silicon via 20 or may be connected to the through silicon via 20 through the third interconnection pattern 74 for a redistributed interconnection.

Figure 20:
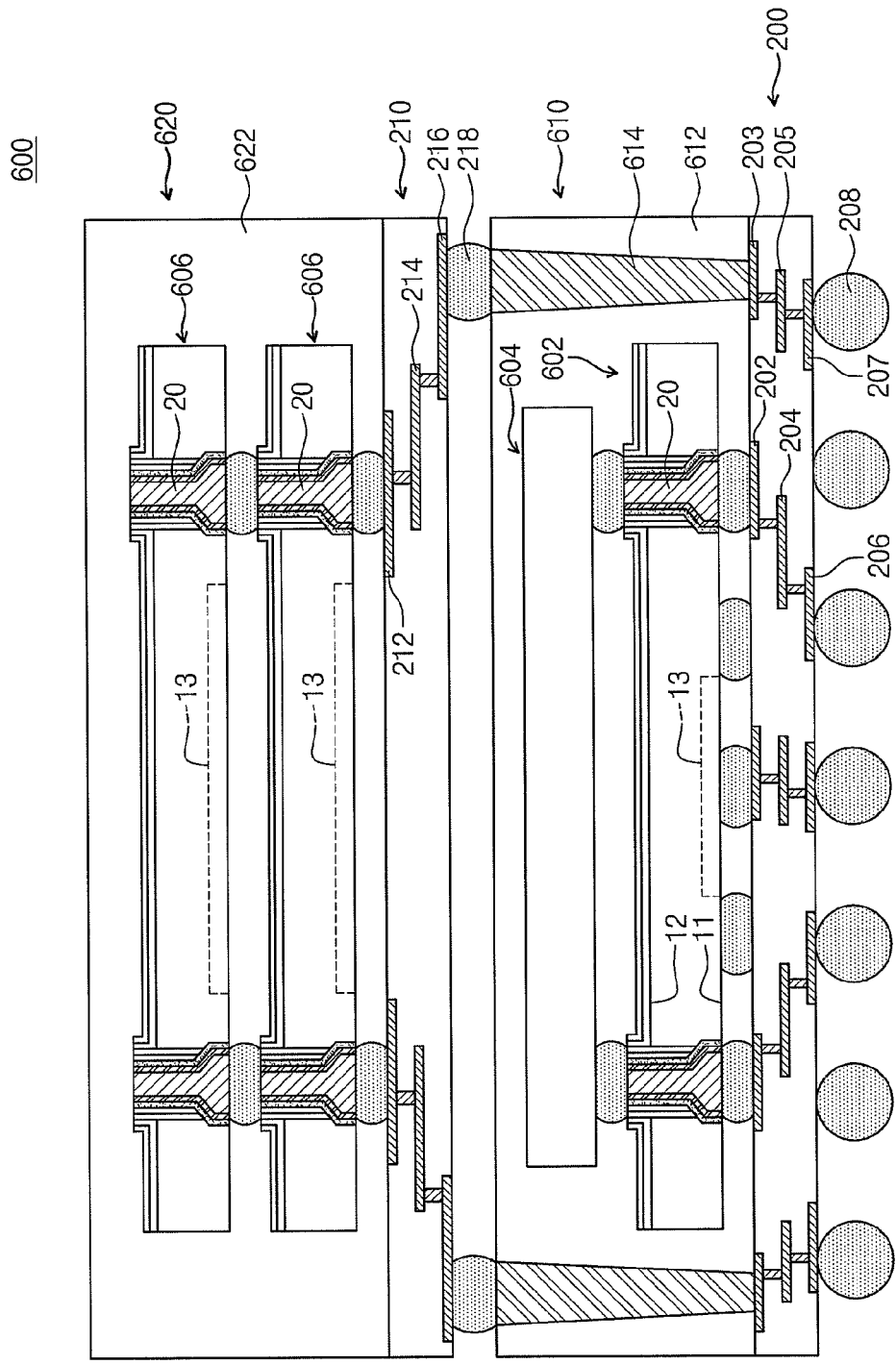
FIG. 20 is a cross sectional view illustrating a semiconductor package in accordance with embodiments of the inventive concept.

FIG. 20 is a cross sectional view illustrating a semiconductor package in accordance with embodiments of the inventive concept.

Referring to FIG. 20, the embodiments described with reference to FIGS. 11 through 19 may be applied to a first semiconductor package 610 of a stacked package 600 and/or a second semiconductor package 620 of the stacked package 600.

The first semiconductor package 610 may include a first semiconductor chip 602 on a first package substrate 200. The embodiment described with reference to FIG. 10 may be applied to the first semiconductor chip 602. The first semiconductor package 610 may further include a protection substance 612 covering at least a portion of the first package substrate 200. For example, the protection substance 612 may be an underfill between a first surface 11 of the first semiconductor chip 602 and the first package substrate 200 or a molding structure covering other surfaces in addition to the first surface 11 of the first semiconductor chip 602. The molding structure may include an epoxy molding compound (EMC). If the protection substance 612 is a molding structure, the first semiconductor package 610 may further include a molding electrode 614 penetrating the molding structure. One end of the molding electrode 614 may be connected to a second circuit pattern 205 of the first package substrate 200 and the other end of the molding electrode 614 may be exposed to the outside. The first semiconductor package 610 may further include a second semiconductor chip 604 on the first semiconductor chip 602.

A second semiconductor package 620 may be stacked on the first semiconductor package 610. The second semiconductor package 620 may include a second package substrate 210 and at least one third semiconductor chip 606 on the second package substrate 210. For example, the third semiconductor chip 606 is a high capacity memory chip and the third semiconductor chips 606 may be connected to each other through silicon vias 20 formed therein. An external connection terminal 218 may be formed on a surface of the second package substrate 210 facing the first semiconductor package 610. The external connection terminal 218 may contact the exposed surface of the molding electrode 614. The second semiconductor package 620 is connected to the outside through a third circuit pattern 214 of the second package substrate 210, the external connection terminal 218, the molding electrode 614 and the second circuit pattern 205 of the first package substrate 200. The second circuit pattern 205 of the first package substrate 200 may be electrically separated from the first circuit pattern 204 connected to the first semiconductor chip 602. Since the first semiconductor package 610 and the second semiconductor package 620 that perform different functions can be vertically stacked, a mounting area may be reduced when compared with mounting the first semiconductor package 610 and the second semiconductor package 620 individually on a module board (702 of FIG. 23) in a subsequent process. The second semiconductor package 620 may further include a protection substance 622 covering at least portions of the second package substrate 210 and the third semiconductor chip 606. For example, the protection substance 622 may be an element that molds at least one third semiconductor chip 606 or is underfilled between the third semiconductor chip 606 of the lowermost layer and the second package substrate 210.

Figure 21:
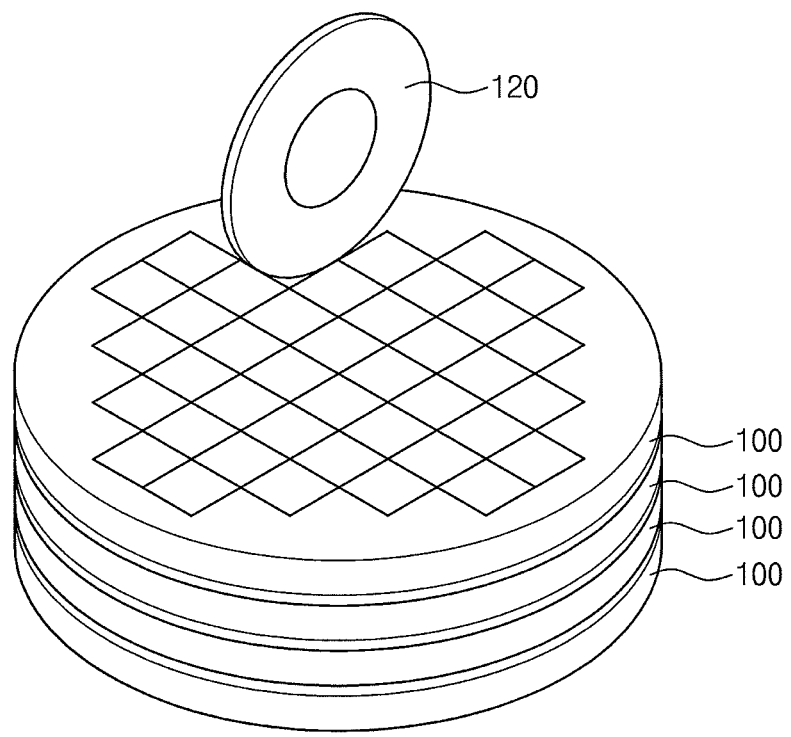
FIGS. 21 and 22 are perspective views illustrating a method of manufacturing a semiconductor package in accordance with embodiments of the inventive concept.
Figure 22:
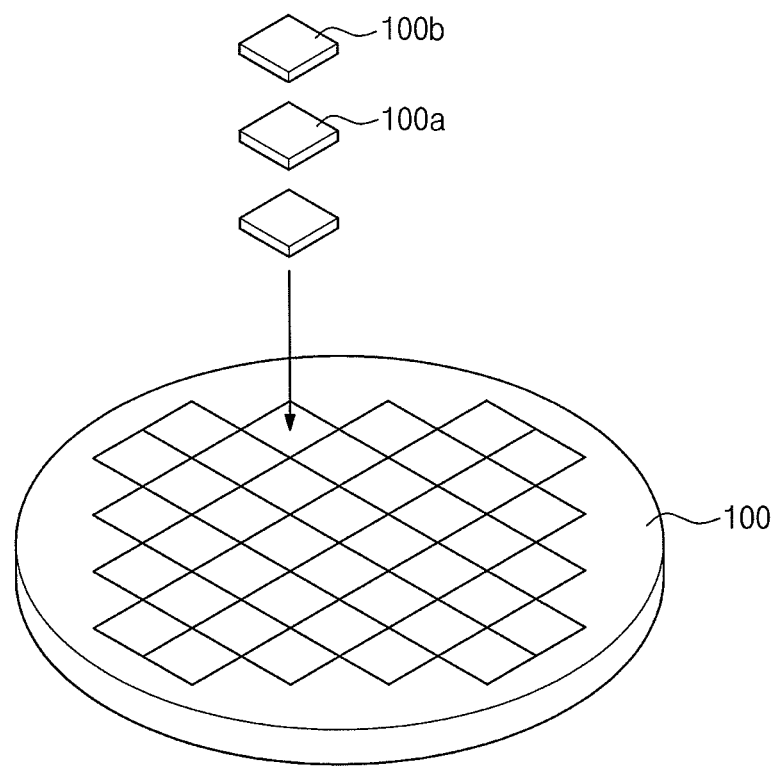

FIGS. 21 and 22 are perspective views illustrating a method of manufacturing a semiconductor package in accordance with embodiments of the inventive concept.

Referring to FIG. 21, there are provided semiconductor wafers 100 in which the semiconductor devices obtained through the semiconductor manufacturing methods illustrated in FIGS. 8A through 9J are formed. A plurality of the semiconductor wafers 100 may be stacked. The stacked semiconductor wafers 100 may be divided into individual semiconductor packages by cutting the stacked semiconductor wafers 100 along a scribe lane of the semiconductor device. Cutting the stacked semiconductor wafers 100 may be performed using a cutter 120 or a laser.

As illustrated in FIG. 22, a semiconductor package may be formed by stacking individual semiconductor devices 100a, 100b, etc. After cutting the semiconductor wafer 100 along a scribe lane of the semiconductor device to separate the wafer 100 into individual semiconductor devices 100a, 100b, etc., a semiconductor package may be formed by stacking the semiconductor devices 100a, 100b, etc.

Figure 23:
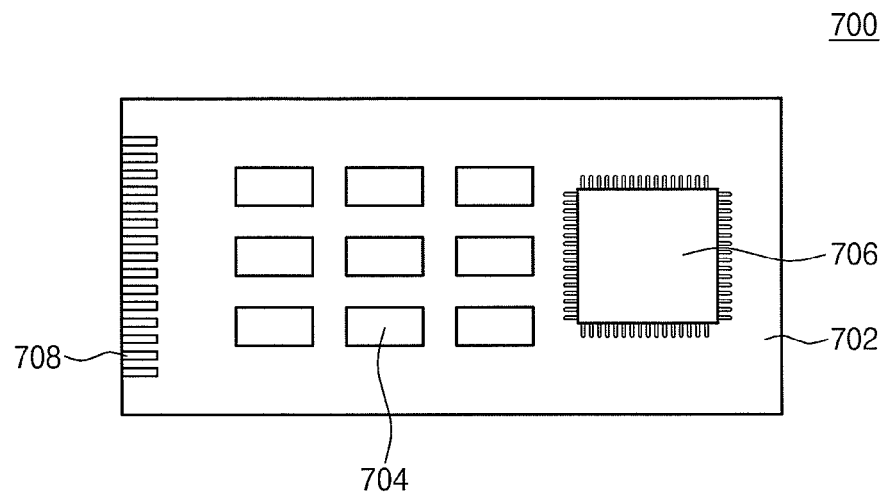
FIG. 23 is a top plan view illustrating a package module in accordance with embodiments of the inventive concept.

FIG. 23 is a top plan view illustrating a package module in accordance with embodiments of the inventive concept.

Referring to FIG. 23, a package module 700 may include a module substrate 702 including external connection terminals 708, semiconductor chips 704 mounted on the module substrate 702 and a semiconductor package 706 of QFP (quad flat package) type. The semiconductor chip 704 and/or the semiconductor package 706 may include a semiconductor device in accordance with embodiments of the inventive concept. The package module 700 may be connected to an external electronic device through the external connection terminals 708.

Figure 24:
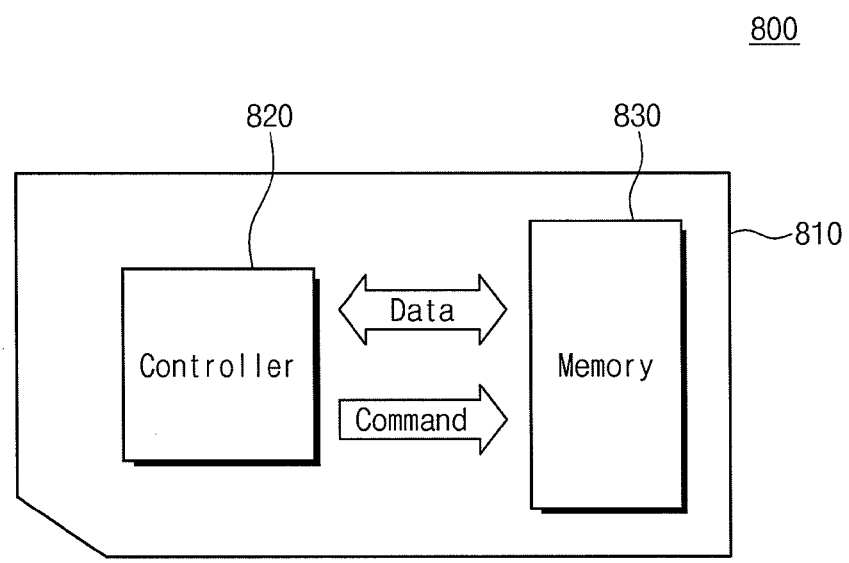
FIG. 24 is a block diagram illustrating a memory card in accordance with embodiments of the inventive concept.

FIG. 24 is a block diagram illustrating a memory card in accordance with embodiments of the inventive concept.

Referring to FIG. 24, a card 800 may include a controller 820 and a memory 830 in a housing 810. The controller 820 and the memory 830 may exchange electrical signals with each other. For example, according to a command of the controller 820, the memory 830 and the controller 820 may exchange data with each other. Thus, the memory card 800 may store data in the memory 830 or may output data stored in the memory 830 to the outside.

The controller 820 and/or the memory 830 may include at least one of the semiconductor devices and the semiconductor packages in accordance with embodiments of the inventive concept. For example, the controller 820 may include a system in package (500 of FIG. 18 or 500' of FIG. 19) and the memory 830 may include a multichip package (400 of FIG. 14 or 400" of FIG. 16). The controller 820 and/or the memory 830 may be provided as a stack type package (600 of FIG. 20). The memory card 800 may be used as a data storage medium for various portable devices. For example, the memory card 800 may include a multi media card (MMC) or a secure digital (SD) card.

Figure 25:
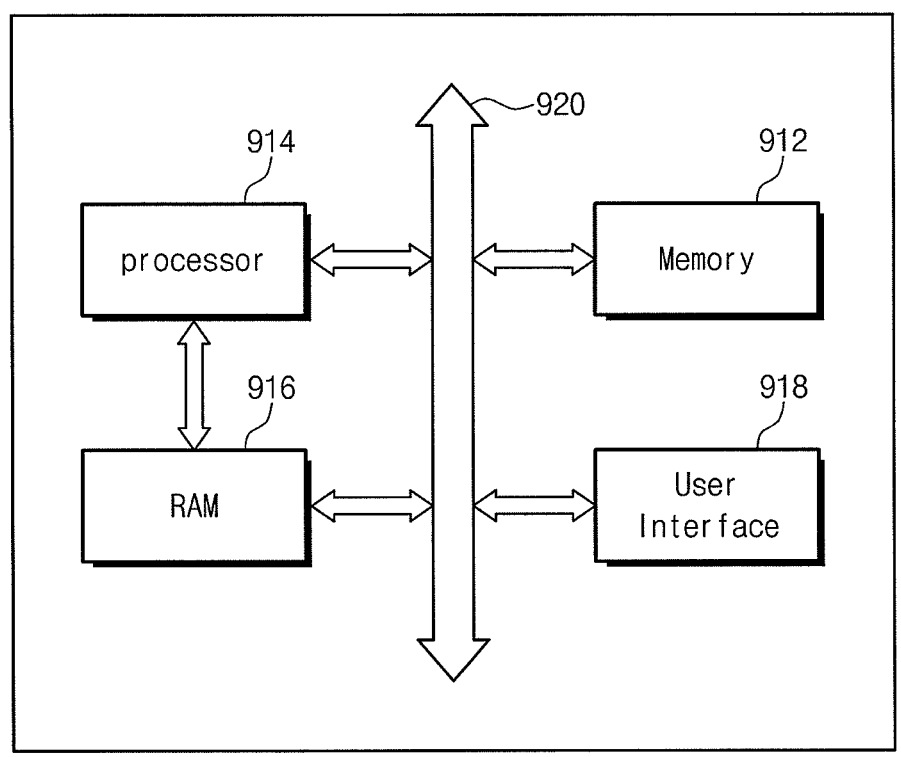
FIG. 25 is a block diagram illustrating an electronic system in accordance with embodiments of the inventive concept.

FIG. 25 is a block diagram illustrating an electronic system in accordance with embodiments of the inventive concept.

Referring to FIG. 25, an electronic system 900 may include at least one of the semiconductor devices and the semiconductor packages in accordance with embodiments of the inventive concept. The electronic system 900 may include, for example, mobile equipment or a computer. For example, the electronic system 900 may include a memory system 912, a processor 914, a RAM 916 and a user interface 918 that can communicate with one another through a bus 920. The processor 914 may execute a program and controls the electronic system 900. The RAM 916 may be used as an operation memory of the processor 914. For example, the processor 914 and the RAM 916 may include the semiconductor device or the semiconductor package in accordance with embodiments of the inventive concept. The processor 914 and the RAM 916 may be included in one package. The user interface 918 may be used to input data into the electronic system 900 or may be used to output data from the electronic system 900. The memory system 912 may store a code for an operation of the processor 914, data processed by the processor 914 and/or data received from the outside. The memory system 912 may include a controller or a memory and may be substantially the same as the memory card 800 of FIG. 24.

Figure 26:
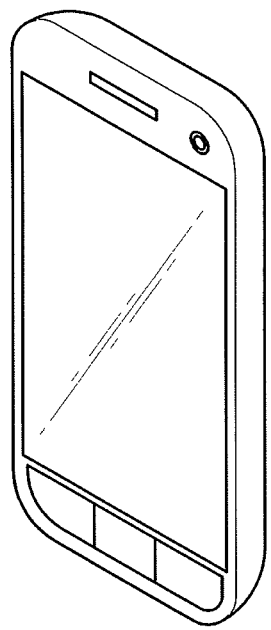
FIG. 26 is a perspective view of an electronic device in accordance with embodiments of the inventive concept.

The electronic system 900 may be applied to an electronic control device of various electronic devices. FIG. 26 illustrates an example where the electronic system (900 of FIG. 25) is applied to a mobile phone 1000. In addition, the electronic system 900 may be applied to a portable notebook device, an MP3 player, a navigation device, a solid state disk (SSD), a vehicle or home appliances.

As described above, a semiconductor device includes a through silicon via structure including an air gap. As a result, a semiconductor device can have improved electronic characteristics and improved reliability.

Although the present inventive concept has been described in connection with the embodiments of the present inventive concept illustrated in the accompanying drawings, it is not limited thereto. It will be apparent to those skilled in the art that various substitutions, modifications and changes may be made thereto without departing from the scope and spirit of the inventive concept.

What is claimed is:

1. A semiconductor device comprising:
a semiconductor substrate having a via hole, the via hole comprising a first region having a first width and a second region having a second width greater than the first width; and
an insulating region including an air gap surrounding and spaced apart from the first region of the via hole.

2. The semiconductor device of claim 1, wherein a portion of the semiconductor substrate is interposed between the air gap and the first region of the via hole.

3. The semiconductor device of claim 1, wherein the air gap is disposed under the second region of the via hole.

4. The semiconductor device of claim 1, wherein a depth of the air gap in the semiconductor substrate is less than a depth of the first region of the via hole in the semiconductor substrate.

5. The semiconductor device of claim 1, comprising a plurality of air gaps surrounding and spaced apart from the first region of the via hole, wherein a portion of the semiconductor substrate is interposed between adjacent air gaps of the plurality of air gaps.

6. The semiconductor device of claim 1, wherein a lower portion of the second region is connected to the first region of the via hole and has a narrowing width.

7. The semiconductor device of claim 1, wherein the insulating region further comprises an insulating film provided along a side of the via hole.

8. The semiconductor device of claim 7, wherein the insulating film fills a portion of the air gap.

9. The semiconductor device of claim 7, further comprising a conductive film filling the via hole,
wherein a contact area of the conductive film in the second region of the via hole is greater than a contact area of the conductive film in the first region of the via hole.

10. A semiconductor device comprising:
a semiconductor substrate;
a through silicon via extending from a first surface of the semiconductor substrate to a second surface of the semiconductor substrate opposite the first surface, wherein the through silicon via includes a first region having a first width and a second region having a second width greater than the first width; and
an air gap surrounding and spaced apart from the first region of the through silicon via, wherein the air gap is positioned under the second region of the through silicon via.

11. The semiconductor device of claim 10, further comprising an insulating film positioned between the through silicon via and the semiconductor substrate.

12. The semiconductor device of claim 11, wherein a portion of the insulating film extends into the air gap.

13. The semiconductor device of claim 11, wherein the insulating film extends onto the first surface of the semiconductor substrate.

14. The semiconductor device of claim 13, wherein an opening in the insulating film exposes a contact pad positioned on the first surface of the semiconductor substrate.

* * * * *